(12) United States Patent
D'Alessandro

(10) Patent No.: US 10,958,217 B2
(45) Date of Patent: Mar. 23, 2021

(54) METHODS, CIRCUITS, AND APPARATUS FOR CALIBRATING AN IN-PHASE AND QUADRATURE IMBALANCE

(71) Applicant: u-blox AG, Thalwil (CH)

(72) Inventor: Carmine D'Alessandro, Thalwil (CH)

(73) Assignee: u-blox AG, Thalwil (CH)

( * ) Notice: Subject to any disclaimer, the term of this patent is extended or adjusted under 35 U.S.C. 154(b) by 55 days.

(21) Appl. No.: 16/221,427

(22) Filed: Dec. 14, 2018

(65) Prior Publication Data
US 2019/0190451 A1    Jun. 20, 2019

Related U.S. Application Data

(60) Provisional application No. 62/598,598, filed on Dec. 14, 2017.

(51) Int. Cl.
*H03D 3/00* (2006.01)
*H04L 27/38* (2006.01)
*H03B 27/00* (2006.01)

(52) U.S. Cl.
CPC ............. *H03D 3/009* (2013.01); *H03B 27/00* (2013.01); *H04L 27/3863* (2013.01)

(58) Field of Classification Search
None
See application file for complete search history.

(56) References Cited

U.S. PATENT DOCUMENTS

| 5,105,195 A * | 4/1992 | Conrad | G01S 7/4021 342/174 |
| 6,061,385 A * | 5/2000 | Ostman | H04L 27/0008 375/130 |
| 6,330,290 B1 * | 12/2001 | Glas | H03D 3/009 329/306 |
| 6,366,622 B1 * | 4/2002 | Brown | H04B 1/30 329/304 |
| 6,373,422 B1 * | 4/2002 | Mostafa | H04B 1/30 341/155 |

(Continued)

OTHER PUBLICATIONS

Ippolito, et al., A CMOS auto-calibrated IQ generator for Sub-GHz ultra low-power transceivers, IEEE 2011, pp. 1-4 .pdf (Year: 2001).*

*Primary Examiner* — Berhanu Tadese
(74) *Attorney, Agent, or Firm* — Finnegan, Henderson, Farabow, Garrett & Dunner LLP

(57) ABSTRACT

Methods, circuits, and apparatus for calibrating an in-phase and quadrature (IQ) imbalance of a communication signal including an in-phase component and a quadrature component in a communication apparatus, the method including determining whether to calibrate the IQ imbalance of the communication signal in the communication apparatus; selecting, in response to a determination to calibrate the IQ imbalance of the communication signal, at least one of an amplitude calibration or a phase calibration; controlling, in accordance with the selected amplitude calibration or phase calibration, at least one of an in-phase delay circuit or a quadrature delay circuit to adjust a pulse of at least one of a first LO signal or a second LO signal to thereby generate at least one pulse-adjusted LO signal; and multiplying the at least one pulse-adjusted LO signal with the communication signal to thereby calibrate the IQ imbalance.

33 Claims, 12 Drawing Sheets

(56) References Cited

U.S. PATENT DOCUMENTS

| | | | | |
|---|---|---|---|---|
| 6,487,787 B1* | 12/2002 | Nahum | G01D 18/008 | 33/702 |
| 7,123,103 B1* | 10/2006 | Rosik | H03L 7/085 | 331/45 |
| 7,298,222 B2* | 11/2007 | Rosik | H03L 7/07 | 331/45 |
| 7,917,091 B2* | 3/2011 | Montemayor | H04B 1/28 | 455/63.1 |
| 8,014,444 B1* | 9/2011 | Marino | H03D 3/008 | 375/235 |
| 8,274,338 B2* | 9/2012 | Leong | H03D 7/166 | 331/45 |
| 8,384,485 B2* | 2/2013 | Fortier | H03L 7/099 | 331/16 |
| 8,396,173 B2* | 3/2013 | Ling | H04B 1/30 | 375/343 |
| 8,406,344 B2* | 3/2013 | Eitel | H03D 3/009 | 375/324 |
| 8,615,205 B2* | 12/2013 | Choksi | H03M 1/66 | 455/115.1 |
| 8,901,988 B2* | 12/2014 | Stroet | H03D 7/1433 | 327/355 |
| 9,008,161 B1* | 4/2015 | Chang | H04L 27/38 | 375/221 |
| 9,362,922 B2* | 6/2016 | Schatzberger | H03L 1/02 | |
| 9,444,560 B1* | 9/2016 | Goh | H04B 17/21 | |
| 9,479,208 B2* | 10/2016 | Papotto | H03F 3/24 | |
| 9,680,674 B2* | 6/2017 | Ling | H04L 27/0014 | |
| 2004/0092241 A1* | 5/2004 | Kim | H04B 1/30 | 455/255 |
| 2005/0123067 A1* | 6/2005 | Kim | H03D 3/009 | 375/298 |
| 2005/0264335 A1* | 12/2005 | Soe | H03H 11/265 | 327/261 |
| 2006/0009180 A1* | 1/2006 | Xu | H04B 17/21 | 455/226.1 |
| 2006/0034356 A1* | 2/2006 | Fechtel | H03D 3/009 | 375/219 |
| 2006/0189290 A1* | 8/2006 | Olson | H03D 7/18 | 455/285 |
| 2006/0220749 A1* | 10/2006 | Rosik | H03L 7/07 | 331/12 |
| 2006/0256911 A1* | 11/2006 | Rosik | H03L 7/07 | 375/376 |
| 2007/0002974 A1* | 1/2007 | Ibrahim | H04L 25/063 | 375/324 |
| 2007/0030079 A1* | 2/2007 | Kawamoto | H03L 7/0995 | 331/16 |
| 2007/0058754 A1* | 3/2007 | Lin | H03D 3/009 | 375/332 |
| 2007/0296519 A1* | 12/2007 | Ezzeddine | H01P 5/185 | 333/131 |
| 2008/0003954 A1* | 1/2008 | Matsuno | H04B 1/71635 | 455/88 |
| 2008/0018383 A1* | 1/2008 | Conte | G11C 5/145 | 327/536 |
| 2008/0024660 A1* | 1/2008 | Wang | H04L 27/3863 | 348/475 |
| 2008/0037684 A1* | 2/2008 | Lin | H03D 3/009 | 375/299 |
| 2008/0057899 A1* | 3/2008 | Montemayor | H04B 1/28 | 455/255 |
| 2008/0165874 A1* | 7/2008 | Steele | H04L 25/061 | 375/261 |
| 2009/0310711 A1* | 12/2009 | Chiu | H04L 27/364 | 375/302 |
| 2010/0014575 A1* | 1/2010 | Malmqvist | H03K 7/04 | 375/238 |
| 2010/0054367 A1* | 3/2010 | Gorday | H04L 25/03006 | 375/324 |
| 2010/0120390 A1* | 5/2010 | Panikkath | H03B 27/00 | 455/208 |
| 2010/0128764 A1* | 5/2010 | Debaillie | H04L 27/368 | 375/220 |
| 2010/0232490 A1* | 9/2010 | Balakrishnan | H03D 3/009 | 375/227 |
| 2010/0321127 A1* | 12/2010 | Watanabe | G01R 31/31924 | 332/149 |
| 2011/0074482 A1* | 3/2011 | Chang | H03K 5/15006 | 327/238 |
| 2011/0200161 A1* | 8/2011 | Tasic | H03K 21/08 | 377/48 |
| 2011/0216858 A1* | 9/2011 | Zeng | H04L 25/08 | 375/346 |
| 2011/0222631 A1* | 9/2011 | Jong | H04L 27/3863 | 375/316 |
| 2012/0039375 A1* | 2/2012 | Eitel | H04L 27/3863 | 375/224 |
| 2012/0177084 A1* | 7/2012 | Cupo | H04L 27/3863 | 375/130 |
| 2012/0187994 A1* | 7/2012 | Yang | H03L 7/0812 | 327/233 |
| 2012/0274370 A1* | 11/2012 | Fortier | H03L 7/099 | 327/156 |
| 2012/0300818 A1* | 11/2012 | Metreaud | H04B 1/30 | 375/219 |
| 2014/0051441 A1* | 2/2014 | Wilhelmsson | H04W 72/082 | 455/436 |
| 2014/0146920 A1* | 5/2014 | Chou | H04L 27/364 | 375/316 |
| 2014/0169410 A1* | 6/2014 | Tanaka | H04B 1/7097 | 375/148 |
| 2014/0312955 A1* | 10/2014 | Stroet | H03D 7/18 | 327/359 |
| 2014/0321516 A1* | 10/2014 | Al-Qaq | H04B 17/29 | 375/221 |
| 2015/0071391 A1* | 3/2015 | Wilhelmsson | H04L 27/3863 | 375/346 |
| 2015/0222272 A1* | 8/2015 | Schatzberger | H03L 1/02 | 331/108 R |
| 2015/0244378 A1* | 8/2015 | d'Alessandro | H03L 3/00 | 331/158 |
| 2016/0065179 A1* | 3/2016 | Taghivand | H03H 7/0153 | 327/554 |
| 2016/0094256 A1* | 3/2016 | Papotto | H04B 1/16 | 375/316 |
| 2016/0094379 A1* | 3/2016 | Grasso | H03D 3/009 | 375/320 |
| 2016/0294491 A1* | 10/2016 | Wu | H04W 24/08 | |
| 2016/0323010 A1* | 11/2016 | Wu | H04L 27/364 | |
| 2016/0373288 A1* | 12/2016 | Subramani | H04L 27/0014 | |
| 2017/0163358 A1* | 6/2017 | Wadell | H04B 17/0085 | |
| 2017/0207747 A1* | 7/2017 | Litmanen | H04L 27/0014 | |
| 2017/0338984 A1* | 11/2017 | Kiran | H04L 27/3854 | |
| 2018/0241606 A1* | 8/2018 | Li | H04B 1/30 | |
| 2019/0190451 A1* | 6/2019 | D'Alessandro | H04L 27/3863 | |

* cited by examiner

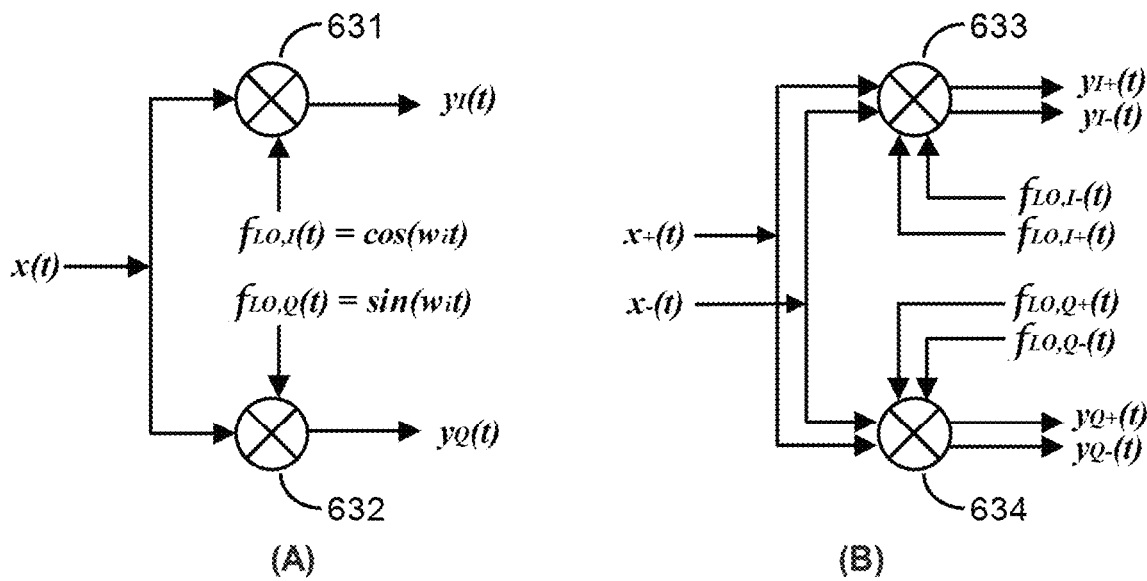
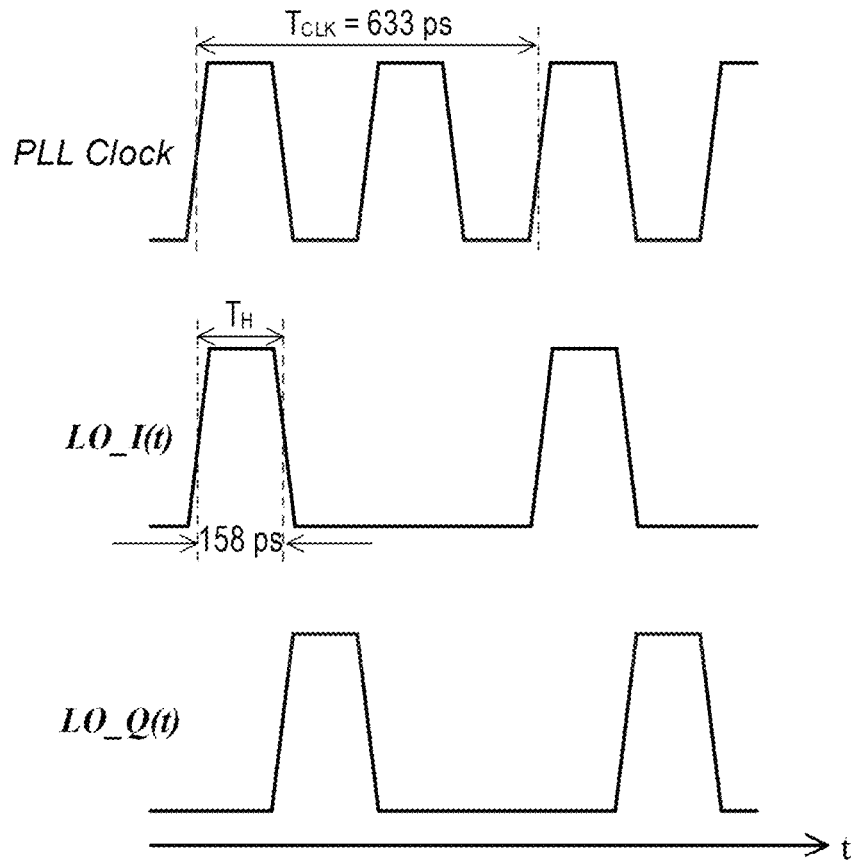
Fig. 6
Fig. 7

METHODS, CIRCUITS, AND APPARATUS FOR CALIBRATING AN IN-PHASE AND QUADRATURE IMBALANCE

CROSS REFERENCE TO RELATED APPLICATION

The present application claims the benefit of priority to U.S. Provisional Applications No. 62/598,598, filed on Dec. 14, 2017, the entire content of which is incorporated herein by reference.

TECHNICAL FIELD

The present disclosure relates to in-phase and quadrature (IQ) imbalance calibration, and more particularly, to methods, circuits, and apparatus for calibrating IQ imbalance for a signal in a wireless communication device.

BACKGROUND

In a wireless communication device, a signal to be transmitted needs to be mixed with a local oscillator (LO) signal to relocate the signal to a radio frequency (RF) for transmission. On the other hand, a received RF signal needs to be mixed with an LO signal to relocate the received RF signal to an intermediate frequency (IF) or baseband frequency for further processing of the signal during reception. The wireless communication device thus contains one or more mixers that mix the signal to be transmitted and the received RF signal by multiplying the signals with the LO signals. When the wireless communication device transmits and receives complex signals, it mixes in-phase (I) components and quadrature (Q) components of the complex signals with two LO signals that have equal amplitude and are phase shifted from each other by 90 degrees.

FIG. 1(A) illustrates exemplary ideal in-phase and quadrature components of the mixed complex signal. As shown in FIG. 1(A), an I component and a Q component of the complex signal have equal amplitude, and the I component is 90 degrees phase shifted from the Q component. In other words, the I and Q components are orthogonal to each other. However, due to channel property and/or hardware impairment, the I and Q components may not be balanced. To illustrate, FIG. 1(A) shows balanced I and Q components in a transmitter or a receiver of the wireless communication device. on the other hand, FIG. 1(B) illustrates imbalanced I and Q components of the mixed complex signal. As shown in FIG. 1(B), the I and Q components are amplitude imbalanced, i.e., $|I| \neq |Q|$, where $|I|$ and $|Q|$ are the amplitudes of the I and Q components. The I and Q components are also phase imbalanced, i.e., $\varphi \neq 90°$, where $\varphi$ is phase shift between the I and Q components. Such IQ imbalance may cause transmission or reception performance degradation in the wireless communication device. Thus, it would be desirable to have a method, circuit, or apparatus for IQ imbalance calibration in the wireless communication device.

Embodiments of the disclosure provide methods, circuits, and apparatus for calibrating an IQ imbalance, which improve amplitude and/or phase balance between I and Q components of complex signals in a wireless communication device.

SUMMARY

Embodiments of the present application provide improved methods, circuits, and apparatus for calibrating an IQ imbalance in a wireless communication device.

These embodiments include a communication apparatus for calibrating an IQ imbalance of a communication signal including an in-phase component and a quadrature component. The communication apparatus includes an oscillator circuit outputting a first LO signal and a second LO signal; an in-phase delay circuit configured to adjust a pulse of the first LO signal, and a quadrature delay circuit configured to adjust a pulse of the second LO signal; a memory storing instructions and a controller configured to execute the instructions stored in the memory and configured to cause the communication apparatus to: determine whether to calibrate the IQ imbalance of the communication signal in the communication apparatus, select, in response to a determination to calibrate the IQ imbalance of the communication signal, at least one of an amplitude calibration or a phase calibration, and control at least one of the in-phase delay circuit or the quadrature delay circuit to adjust a pulse of at least one of the first LO signal or the second LO signal in accordance with the selected amplitude calibration or phase calibration and to thereby generate an at least one pulse-adjusted LO signal; and a mixer configured to multiply the at least one pulse-adjusted LO signal with the communication signal and to thereby calibrate the IQ imbalance.

These embodiments also include a method for calibrating an IQ imbalance of a communication signal including an in-phase component and a quadrature component in a communication apparatus. The method includes determining whether to calibrate the IQ imbalance of the communication signal in the communication apparatus; selecting, in response to a determination to calibrate the IQ imbalance of the communication signal, at least one of an amplitude calibration or a phase calibration; controlling, in accordance with the selected amplitude calibration or phase calibration, at least one of an in-phase delay circuit or a quadrature delay circuit to adjust a pulse of at least one of a first LO signal or a second LO signal to thereby generate at least one pulse-adjusted LO signal; and multiplying the at least one pulse-adjusted LO signal with the communication signal to thereby calibrate the IQ imbalance.

These embodiments further include an RF circuit for calibrating an IQ imbalance of a communication signal including an in-phase component and a quadrature component. The RF circuit includes an oscillator circuit outputting a first LO signal and a second LO signal; an in-phase delay circuit configured to adjust a pulse of the first LO signal, and a quadrature delay circuit configured to adjust a pulse of the second LO signal; a control circuit configured to cause the RF circuit to: determine whether to calibrate the IQ imbalance of the communication signal in the RF circuit, select, in response to a determination to calibrate the IQ imbalance of the communication signal, at least one of an amplitude calibration or a phase calibration, and control at least one of the in-phase delay circuit or the quadrature delay circuit to adjust a pulse of the at least one of the first LO signal or the second LO signal in accordance with the selected amplitude calibration or phase calibration and to thereby generate an at least one pulse-adjusted LO signal; and a mixer configured to multiply the at least one pulse-adjusted LO signal with the communication signal and to thereby calibrate the IQ imbalance.

It is to be understood that the foregoing general description and the following detailed description are exemplary and explanatory only, and are not restrictive of the invention, as claimed.

BRIEF DESCRIPTION OF THE DRAWINGS

FIG. 6 illustrates exemplary quadrature mixers for IQ imbalance calibration, according to some embodiments of the present disclosure.

FIG. 7 illustrates exemplary LO signals of the exemplary LO generator shown in FIG. 3, 4, or 5, according to some embodiments of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses, circuits, and methods consistent with aspects related to the invention as recited in the appended claims.

Figure 1:
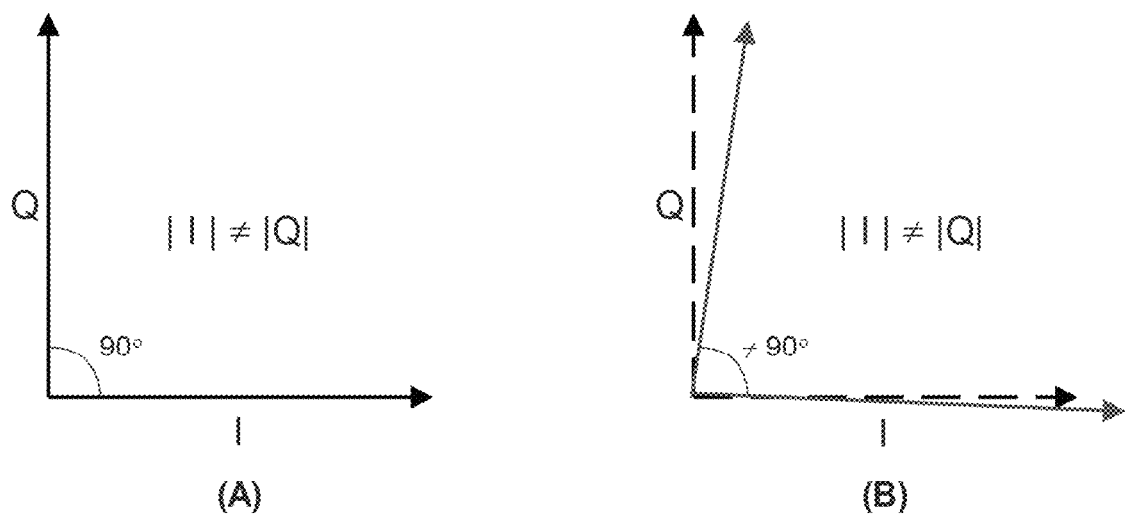
FIG. 1 illustrates exemplary ideal and imbalanced in-phase and quadrature components of a signal, according to some embodiments of the present disclosure.

FIG. 1(A) illustrates the exemplary ideal in-phase and quadrature components of the mixed complex signal, according to some embodiments of the present disclosure. As shown in FIG. 1(A), the I and Q components have equal amplitude and are 90 degrees phase shifted from each other. A wireless communication apparatus that mixes the ideally IQ-balanced signal may not induce an undesired frequency component at an image frequency. A transmitter or receiver of the wireless communication apparatus may therefore not be necessary to filter the image frequency from the mixed signals. However, the I and Q components of the mixed signals may not be balanced due to real channel property and/or hardware impairment of the transmitter or receiver components.

FIG. 1(B) illustrates exemplified imbalanced I and Q components of the mixed complex signal, according to some embodiments of the present disclosure. As shown in FIG. 1(B), the I component has greater amplitude than the Q component, i.e., amplitude imbalance when $|I| \neq |Q|$. The I and Q components are also not phase shifted by 90 degrees from each other, i.e., phase imbalance when $\varphi \neq 90°$. The imbalanced I and Q components of the mixed signals may cause transmission or reception performance degradation in the wireless communication apparatus. The communication apparatus may need to calibrate the amplitude imbalance and/or the phase imbalance in the transmitter or receiver.

Figure 2:
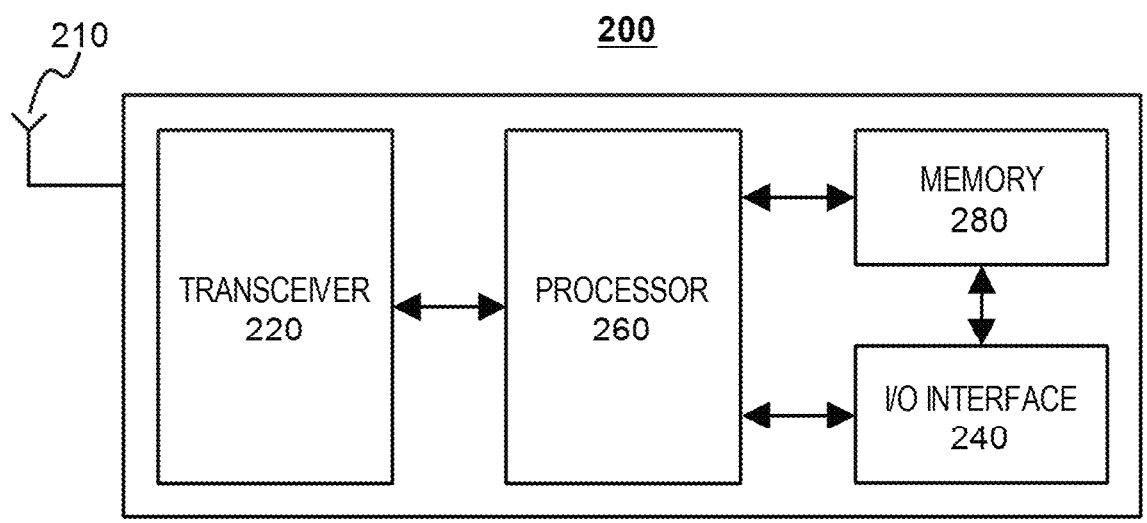
FIG. 2 illustrates an exemplary apparatus for IQ imbalance calibration, according to some embodiments of the present disclosure.

FIG. 2 illustrates an exemplary apparatus 200 for IQ imbalance calibration, according to some embodiments of the present disclosure. Apparatus 200 includes an antenna 210, a transceiver 220, an I/O interface 240, a processor 260, and a memory 280. One or more of these elements of apparatus 200 may be included for IQ imbalance calibration. These elements may be configured to transfer data and signals and send or receive instructions between or among each other.

Antenna 210 may include one or more conductors (elements), electrically connected to transceiver 220. During reception, oscillating electric and magnetic fields of an incoming radio wave exert force on electrons in antenna elements of antenna 210, causing them to move back and forth, creating oscillating currents in antenna 210. Accordingly, antenna 210 can be configured to receive radio waves, i.e., radio signals, in a wireless communication environment. On the contrary, during transmission, antenna 210 can create and transmit radio signals for transceiver 220.

Transceiver 220, may include a transmitter and/or a receiver to transmit and/or receive control signals and data of apparatus 200 with IQ imbalance calibration. The transmitter of apparatus 200 may include one or more digital-to-analog converters (DACs), IF amplifiers and filters, mixers, RF amplifiers and filters, LO signal generators, and delay circuits that can transmit control signals and data with IQ imbalanced calibration. The receiver of apparatus 200 may include one or more RF amplifiers and filters, mixers, IF amplifiers and filters, analog-to-digital converters (ADCs), LO signal generators, and delay circuits that can receive control signals and data with IQ imbalanced calibration. The transmitter and the receiver may further include control circuits that control their components to calibrate IQ imbalance as illustrated afterward in FIGS. 3-15. In some embodiments, processor 260 may control those components of the transmitter and the receiver to calibrate IQ imbalance as illustrated afterwards in FIGS. 3-15.

I/O interface 240 may be configured to facilitate communication between apparatus 200 and other apparatuses. For example, I/O interface 240 may receive a signal from another apparatus (e.g., a computer) including system configuration information for apparatus 200. I/O interface 240 may also output received control signals, received data, or measurement results to other apparatus.

Processor 260 includes any appropriate type of general-purpose or special-purpose microprocessor, digital signal processor, or processor. Processor 260 can be representative of one or more processors in apparatus 200. Processor 260 can be configured by one or more programs stored in memory 280 to perform operations of apparatus 200 described afterward with respect to the methods, circuits, and apparatus shown in FIGS. 3-15.

Memory 280 may include any appropriate type of mass storage provided to store any type of information that processor 260 may need to operate. Memory 280 may be a volatile or non-volatile, magnetic, semiconductor, tape, optical, removable, non-removable, or other type of storage device or tangible (i.e., non-transitory) computer-readable medium including, but not limited to, a read-only memory (ROM), a flash memory, a dynamic random-access memory (RAM), and a static RAM. Memory 280 may be configured to store one or more programs for execution by processor 260 for IQ imbalance calibration, as disclosed herein.

Memory 280 may be further configured to store information and data used by processor 260. For instance, memory 280 may be configured to store received control signals, received data, measurement results, and configuration of delay circuits for apparatus 200.

Figure 3:
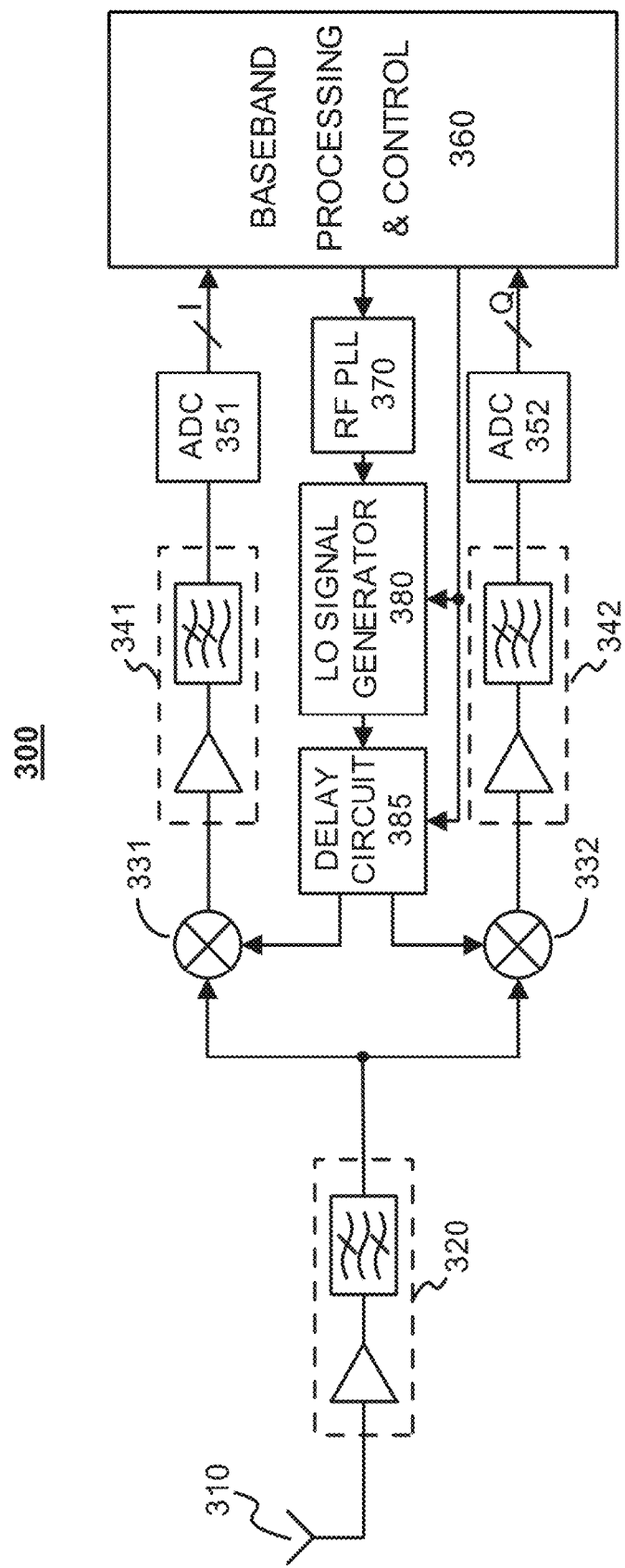
FIG. 3 illustrates an exemplary receiver for IQ imbalance calibration, according to some embodiments of the present disclosure.

FIG. 3 illustrates an exemplary receiver 300 for IQ imbalance calibration, according to some embodiments of the present disclosure. Receiver 300 includes an antenna 310, an RF Amplifier and Filter 320, two mixers 331 and 332, two IF Amplifier and Filter 341 and 342, two ADCs 351 and 352, a baseband processing and control 360, an RF phase-locked loop (PLL) 370, an LO signal generator 380, and a delay circuit 385. One or more of these elements of apparatus 300 may be included for IQ imbalance calibration. These elements may be configured to transfer signals and send or receive instructions between or among each other.

Antenna 310 may be configured as described above for antenna 210. Antenna 310 may be further configured to receive a radio signal and send to RF Amplifier and Filter 320.

RF Amplifier and Filter 320 includes one or more amplifiers and one or more filters to amplify and filter the received RF signal from antenna 310. After amplification and filtering, RF Amplifier and Filter 320 sends the RF signal to mixers 331 and 332 as I and Q components of the received RF signal, respectively.

Mixer 331 multiplies the I component of the received RF signal with an LO signal for the in-phase component from delay circuit 385, thereby converting the I component of the received RF signal to an IF signal. Mixer 331 then sends the IF signal representing the I component to IF Amplifier and Filter 341. On the other hand, mixer 332 multiplies the Q component of the received RF signals with an LO signal for quadrature component from delay circuit 385, thereby converting the Q component of the received RF signal to another IF signal. Mixer 332 then sends the IF signal representing the Q component to IF Amplifier and Filter 342.

IF Amplifier and Filter 341 includes one or more amplifiers and one or more filters to amplify and filter the received IF signal from mixer 331. After amplification and filtering, IF Amplifier and Filter 341 sends the IF signal representing the I component to ADC 351. On the other hand, IF Amplifier and Filter 342 also includes one or more amplifiers and one or more filters to amplify and filter the received IF signal representing the Q component from mixer 332. After amplification and filtering, IF Amplifier and Filter 341 sends the IF signal representing the Q component to ADC 352.

ADC 351 converts the received IF signal representing the I component to a digital baseband signal and sends to baseband processing and control 360. On the other hand, ADC 352 also converts the received IF signal representing the Q component to another digital baseband signal and sends to baseband processing and control 360.

Baseband receiver and controller 360 includes a baseband receiver and a baseband controller. The baseband receiver receives and processes the I and Q baseband signals to obtain control signals and/or data transmitted in the RF signals. The baseband controller is configured to control components of the baseband receiver to process the I and Q baseband signals for reception of the control signals and data. The baseband controller is also configured to control RF PLL 370 and LO signal generator 380 to generate LO signals sent to mixers 331 and 332. The baseband controller can be further configured to estimate IQ imbalance in the received I and Q baseband signals, and control delay circuit 385 to adjust the phase of the LO signals in accordance with the estimated IQ imbalance. Accordingly, mixers 331 and 332 multiply the I and Q components of the received RF signal with the phase-adjusted LO signals from delay circuit 385 to calibrate the estimated IQ imbalance in the received signal.

Delay line 385 includes a plurality of delay components, such as analog delay circuits, digital circuits, and a combination of analog and digital circuits. Delay circuit 385 is configurable to change its time delay based on control signals from baseband processing and control 360. For example, delay circuit 385 may contain a plurality of resistor and capacitor (RC) circuits in which one or more resistors are variable resistors. baseband processing and control 360 can adjust these variable resistors of delay circuit 385 to increase or decrease time delay of the LO signals, and therefore adjust the phase of the LO signals for IQ imbalance calibration.

Figure 4:
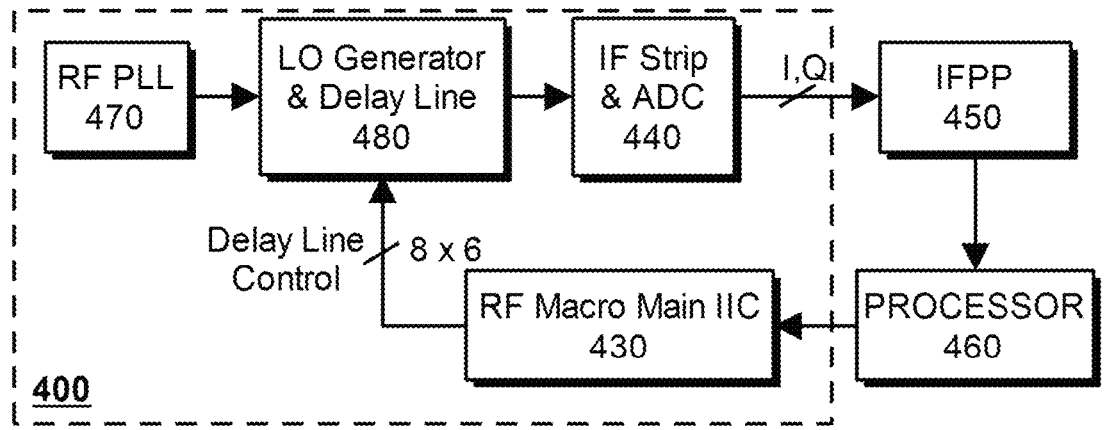
FIG. 4 illustrates an exemplary system for IQ imbalance calibration, according to some embodiments of the present disclosure.

FIG. 4 illustrates an exemplary system 400 for IQ imbalance calibration, according to some embodiments of the present disclosure. System 400 includes an RF Macro Main inter-integrated circuit (IIC) 430, an IF Strip & ADC 440, an RF PLL 470, and an LO generator & delay line 480. As illustrated in FIG. 4, system 400 are coupled to an IF pre-processor (IFPP) 450 and a processor 460 for calibrating the IQ imbalance.

Among these components of system 400, RF PLL 470 is configured to generate a master clock signal, i.e., an RF PLL clock, for use of driving LO generator & delay line 480. LO generator & delay line 480 is configured to generate LO signals based on the RF PLL clock from RF PLL 470. LO generator & delay line 480 is also configured to adjust phase of the LO signals by a delay line. The delay line is configured to change its time delay in accordance with one or more delay line control signals received from RF Macro Main IIC 430. LO generator & delay line 480 then feeds the phase-adjusted LO signals to, for example, a quadrature mixer in IF Strip & ADC 440.

The quadrature mixer of IF Strip & ADC 440 is configured to multiply the phase-adjusted LO signals with incoming RF signals for calibrating IQ imbalance and converting to IF signals. One or more ADCs of IF Strip & ADC 440 then sample the IF signals and obtain digital I and Q signals for further receiving processes. IFPP 450 is configured to receive and filter the digital I and Q signals through digital high-pass filters to remove direct current (DC) offsets. IFPP 450 can also be configured to estimate IQ imbalance in the filtered I and Q signals and send the estimated IQ imbalance to processor 460. For example, IFPP 450 can store the estimated IQ imbalance in memory that processor 460 can access and notify processor 460 of the estimation.

Microcontroller 460 is configured to determine whether to calibrate IQ imbalance and amount of phase adjustment to the LO signals for IQ imbalance calibration. When processor 460 determines to calibrate IQ imbalance and determines the amount of phase adjustment to LO signals, processor 460 is configured to control RF Macro Main IIC 430 to send delay line control signals to the delay line in LO generator & delay line 480.

Before processor 460 determines to calibrate the IQ imbalance, IFPP 450 is configured to estimate amounts of amplitude imbalance and phase imbalance present in the received I and Q signals. For example, IFPP 450 can be configured to estimate amplitude imbalance in accordance with the following method.

IFPP 450 can be configured to calculate average magnitudes of the received I and Q signals as follows:

$$|I| = sqrt\left(\sum_{k=0}^{N-1} I_k^2\right), |Q| = sqrt\left(\sum_{k=0}^{N-1} Q_k^2\right) \quad (1)$$

where N is a number of samples over which an average magnitude is calculated, k is an index of samples, $0 \leq k \leq N-1$, and $|I|$ and $|Q|$ are average magnitudes of the I and Q signals, respectively.

Then, IFPP 450 can be configured to estimate amplitude imbalance in accordance with a difference between the average magnitudes of the I and Q signals as follows:

$$\Delta = |I| - |Q| \quad (2)$$

Alternatively, IFPP 450 can be configured to estimate the amplitude imbalance in accordance with: $\Delta = |Q| - |I|$.

When the difference between the I and Q magnitudes is not zero, i.e., $\Delta \neq 0$ or $|I| \neq |Q|$, the amplitude imbalance is present in the I and Q signals.

IFPP 450 can also be configured to estimate phase imbalance in accordance with the following method.

An inner product between the I and Q signals can be calculated in accordance with:

$$\langle I, Q \rangle = |I| \cdot |Q| \cos \theta \quad (3)$$

where $\langle I, Q \rangle$ represents the dot product of the I and Q signals, and $\theta$ is a phase angle between the I and Q signals.

The inner product between the I and Q signals can also be calculated in accordance with:

$$\langle I, Q \rangle = \sum_{k=0}^{N-1} I_k Q_k^* \quad (4)$$

where $Q^*$ denotes the complex conjugate of the Q signal.

In accordance with equations (3) and (4), IFPP 450 can be configured to calculate the phase angle $\theta$ between the I and Q signals in accordance with:

$$\theta = \cos^{-1}\left(\frac{\langle I, Q \rangle}{|I| \cdot |Q|}\right) \quad (5)$$

In an ideal scenario, the phase angle between the I and Q channels should be 90°. However, in a real channel environment and hardware implementation, a phase offset, or phase imbalance, may be present due to channel property and hardware impairment. The phase offset, or a value of phase imbalance, can be defined as:

$$\phi = \frac{\pi}{2} - \theta \quad (6)$$

where $\phi$ is the phase shift or the value of phase imbalance.

A person of ordinary skill in the art knows that a sinusoidal signal can be expressed by a cosine signal with phase shift of $$\frac{\pi}{2}.$$

That is:

$$\cos\left(\frac{\pi}{2} - \varphi\right) = \sin\varphi \quad (7)$$

According to equation (7), IFPP 450 can also be configured to calculate the phase offset, or the value of phase imbalance, in accordance with:

$$\phi = \sin^{-1}\left(\frac{\langle I, Q \rangle}{|I| \cdot |Q|}\right) \quad (8)$$

In some embodiments, IFPP 450 can send the filtered I and Q signals to processor 460, and instead processor 460 can be configured to estimate IQ imbalance as described in equations (1) to (8).

Figure 5:
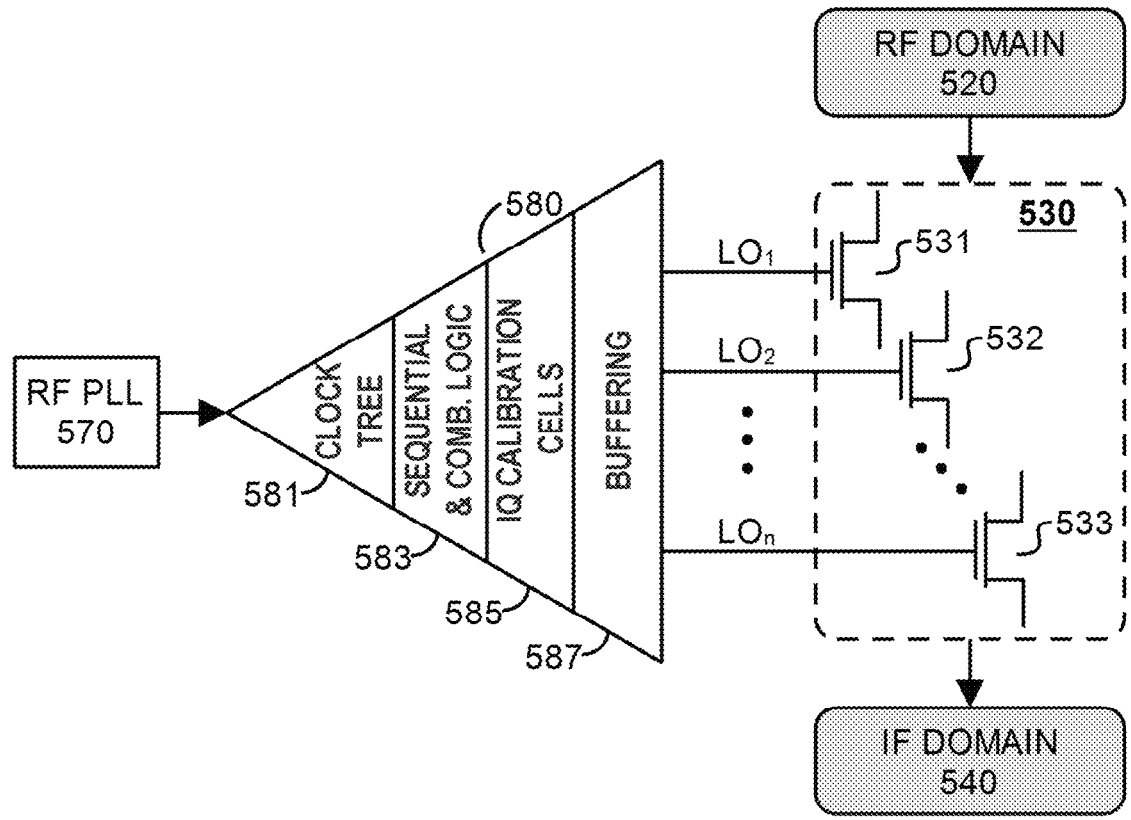
FIG. 5 illustrates an exemplary LO signal generator among components of an exemplary receiver for IQ imbalance calibration, according to some embodiments of the present disclosure.

FIG. 5 illustrates an exemplary LO signal generator 580 among components of an exemplary receiver for IQ imbalance calibration, according to some embodiments of the present disclosure. LO signal generator 580 includes a clock tree 580, a sequential and combinational logic circuit 583, IQ calibration cells 585, and a buffering circuit 587.

Clock tree 581 is a clock distribution circuit and is configured to distribute a clock signal from an RF PLL 570 to components of LO signal generator 580 and components of the receiver that need it. Sequential and combinational logic circuit 583 is configured to control operations of LO signal generator 580. Buffering circuit 587 is configured to buffer generated LO signals before LO signal generator 580 sends them to mixers 530 of the receiver.

IQ calibration cells 585 includes a plurality of programmable delay cells that are configured to be delay lines for LO signals. For example, a group of the programmable delay cells can be configured to implement a delay line for LO signal $LO_1$. The delay line can be programmed to adjust rising and falling edges of pulses in the $LO_1$ signal before LO signal generator 580 sends the $LO_1$ signal to mixer 531. Another group of the programmable delay cells can be configured to implement another delay line for LO signal $LO_2$. The delay line can also be programmed to adjust rising and falling edges of pulses in the $LO_2$ signal before LO signal generator 580 sends the $LO_2$ signal to mixer 532. In other words, LO signal generator 580 includes a plurality of delay lines in IQ calibration cells 585, and each delay line is configured to adjust rising and falling edges of pulses of an LO signal before LO signal generator 580 sends the LO signal to mixer 530. Accordingly, LO signal generator 580 is configured to generate LO signals and adjust rising and falling edges of pulses of the LO signals to mixer 530 for IQ imbalance calibration.

The delay lines in IQ imbalance cells 585 can be programmed by, for example, six bits to adjust rising edges and another six bits to adjust falling edges of pulses of an LO signal in a sub-picosecond range.

FIG. 6 illustrates exemplary quadrature mixers for IQ imbalance calibration, according to some embodiments of the present disclosure. FIG. 6(A) illustrates exemplary quadrature mixers 631 and 632 for IQ imbalance calibration. For example, as shown in FIG. 6(A), mixer 631 is configured to mix a received signal x(t) with an LO signal $f_{LO,I}(t)$ to obtain an in-phase component of the received signal x(t), i.e., $y_I(t)$. On the other hand, mixer 632 is configured to mix the received signal x(t) with another LO signal $f_{LO,Q}(t)$ to obtain a quadrature component of the received signal x(t), i.e., $y_Q(t)$. The LO signals $f_{LO,I}(t)$ and $f_{LO,Q}(t)$ may have 90 degrees phase shift. For example, $f_{LO,I}(t) = \cos(w_t t)$ and $f_{LO,Q}(t) = \sin(w_t t)$. The delay circuit or delay line of FIG. 3, 4, or 5 can be configured to adjust the LO signals $f_{LO,I}(t)$ and $f_{LO,Q}(t)$ to calibrate amplitude and/or phase imbalance between the in-phase component $y_I(t)$ and the quadrature components $y_Q(t)$.

FIG. 6(B) illustrates exemplary differential quadrature mixers 633 and 634 for IQ imbalance calibration. A received communication signal x(t) includes a positive received signal $x_+(t)$ and a negative received signal $x_-(t)$, and both the positive and negative received signals are send to a mixer for an in-phase component and another mixer for a quadrature component. For example, as shown in FIG. 6(B), mixer 633 is configured to mix a positive received signal $x_+(t)$ with an LO signal $f_{LO,I+}(t)$ and to mix a negative received signal $x_-(t)$ a differential LO signal $f_{LO,I-}(t)$ to obtain an in-phase component and a differential in-phase component of the received signal x(t), i.e., $y_{I+}(t)$ and $y_{I-}(t)$. On the other hand, mixer 634 is configured to mix the positive received signal $x_+(t)$ with another LO signal $f_{LO,Q+}(t)$ and to mix the negative received signal $x_-(t)$ with another differential LO signal $f_{LO,Q-}(t)$ to obtain a quadrature component and a differential quadrature component of the received signal x(t), i.e., $y_{Q+}(t)$ and $y_{Q-}(t)$. The delay circuit or delay line of FIG. 3, 4, or 5 can be configured to adjust the LO signals $f_{LO,i+}(t)$, $f_{LO,I-}(t)$, $f_{LO,Q+}(t)$, and $f_{LO,Q-}(t)$ to calibrate amplitude and/or phase imbalance between the in-phase components $y_{I+}(t)$ and $y_{I-}(t)$, and the quadrature components $y_{Q+}(t)$ and $y_{Q-}(t)$.

A mixer is configured to mix a signal with another signal. For example, the mixer multiplies an incoming signal (the signal to be "relocated") with an LO signal to generate an output signal at a different frequency from the incoming signal. In other words, the input signal is relocated to another frequency that is different from its original frequency. A communication device can make use of different LO signals with different frequencies to relocate the incoming signal to a frequency in interest. A frequency of the LO signal can produce the frequency translation.

For example, as shown in FIG. 6(A), mixer 631 multiplies the incoming signal x(t) with the LO signal $f_{LO,I}(t)$ and mixer 632 multiplies the incoming signal x(t) with the LO signal $f_{LO,Q}(t)$ that is 90 degrees phase shifted or out-of-phase with respect to the LO signal $f_{LO,I}(t)$. For example, the LO signal $f_{LO,Q}(t)$ and the LO signal $f_{LO,I}(t)$ can be a sine signal and a cosine signal, respectively. Mixers 631 and 632 output two signals: $Y_I(t)$ and $y_Q(t)$, which are referred to as the in-phase (I) component and the quadrature (Q) component of the signal.

The arrangement of two mixers 631 and 632 can also be referred to as a complex, I/O, or quadrature mixer. The LO signal $f_{LO,Q}(t)$ and the LO signal $f_{LO,I}(t)$ can be of 50% duty cycles, respectively.

Alternatively, a differential mixer implementation can mix the incoming signal with four LO signals, instead of two LO signals. For example, as shown in FIG. 6(B), the in-phase LO signal $f_{LO,I+}(t)$ is for use with a non-inverting part of mixer 633, and the in-phase LO signal $f_{LO,I-}(t)$ is for use with an inverting part of mixer 633. Similarly, the quadrature LO signal $f_{LO,Q+}(t)$ is for use with a non-inverting part of mixer 634, the quadrature LO signal $f_{LO,Q-}(t)$ is for use with an inverting part of mixer 634.

The arrangement of two mixers 633 and 634 can also be referred to as a differential quadrature mixer. The LO signals $f_{LO,I+}(t)$, $f_{LO,I-}(t)$, $f_{LO,Q+}(t)$, and $f_{LO,Q-}(t)$ can be of 25% duty cycles, respectively.

FIG. 7 illustrates exemplary digital LO adjust signals for the exemplary LO generator shown in FIG. 3, 4, or 5, according to some embodiments of the present disclosure. As shown in FIG. 7, a PLL clock $T_{CLK}$ in an RF front-end circuit can be, for example, 633 picoseconds (ps). Two digital LO adjust signals LO_I(t) and LO_Q(t) with 25% duty cycles are each contain a pulse with $T_H$=158 ps, respectively. As shown in FIG. 7, the digital LO adjust signals LO_I(t) and LO_Q(t) are signals that control an in-phase delay circuit and a quadrature delay circuit to adjust LO signals for calibrating the IQ imbalance in the received communication signal. The digital LO adjust signals LO_I(t) and LO_Q(t) can be configured to adjust, for example, the LO signals $f_{LO,I}(t)$ and $f_{LO,Q}(t)$ of FIG. 6(A) for calibrating an IQ imbalance between the in-phase component $y_I(t)$ and the quadrature components $y_Q(t)$. In some embodiments, the two digital LO adjust signals LO_I(t) and LO_Q(t) can have duty cycles different from 25%, such as 20%, 30%, 40%, or 50% duty cycles.

Alternatively, four digital LO adjust signals LO_I_+(t), LO_I_-(t), LO_Q_+(t), and LO_Q_-(t) can be used to control four delay circuits to adjust, for example, the four LO signals $f_{LO,I+}(t)$, $F_{LO,I-}(t)$, $f_{LO,Q+}(t)$, and $f_{LO,Q-}(t)$ of FIG. 6(B) for calibrating an IQ imbalance between the in-phase component $y_{I+}(t)$ and the quadrature component $y_{Q+}(t)$, and/or between the in-phase component $y_{I-}(t)$ and the quadrature component $y_{Q-}(t)$. The four digital LO adjust signals LO_I_+(t), LO_I_-(t), LO_Q_+(t), and LO_Q_-(t) with 25% duty cycles can each contain a pulse with $T_H$=158 ps, respectively. These digital LO adjust signals are non-overlapped periodic clock signals that are sequentially delayed by $T_{CLK}/4$ with respect to the previous digital LO adjust signal. In other words, these digital LO adjust signals with 25% duty cycle are 90 degrees out of phase with respect to the next digital LO adjust signal.

In some embodiments, these digital LO adjust signals can also be of 50% duty cycles. Alternatively, these digital LO adjust signals may be of 20% or 40% duty cycles.

The quadrature mixers described above in FIG. 6 can mix each signal individually. For example, an in-phase signal and a quadrature signal are each a real-valued signal. However, when the two signals are processed in a real RF circuit, the two signals are combined as a complex-valued signal, i.e., I+jQ or $y_I(t)+j\,y_Q(t)$. When the RF circuit can operate its functions ideally and does not have any deficiencies, an ideal quadrature mixer can result in a simple frequency shift of the input signal without the production of an undesired frequency component, i.e., an image. This property is especially useful in a highly integrated transceiver since the RF circuit is not necessary to include a narrow-band filter to remove undesired images for a desired signal.

The ideal property mentioned above with respect to images only holds if the in-phase and quadrature signals, appearing on an I channel and a Q channel, respectively, have the same amplitude and are orthogonal to each other, as illustrated in FIG. 1(A). However, the real RF circuit, due to different channels and component properties, the amplitude of the in-phase and quadrature signals may not be identical, i.e., an amplitude imbalance. Similarly, the in-phase and quadrature signals may not be of exactly 90 degrees out of phase to each other, i.e., a phase imbalance. As noted above, FIG. 1(B) illustrates the amplitude imbalance and the phase imbalance.

When the amplitude imbalance and/or the phase imbalance exist in the RF circuit, a quadrature mixer with an IQ-imbalanced input signal not only translates the desired signal but also introduces its image into the spectrum, inducing interference. The image can cause an error floor in performance which not only limits performance of a modulator and a demodulator but also causes distortion in a transmission chain or a reception chain of a communication device. Accordingly, the disclosure discloses a delay circuit or a delay line to adjust a pulse of an LO signal for calibrating the amplitude imbalance and the phase imbalance.

Figure 8:
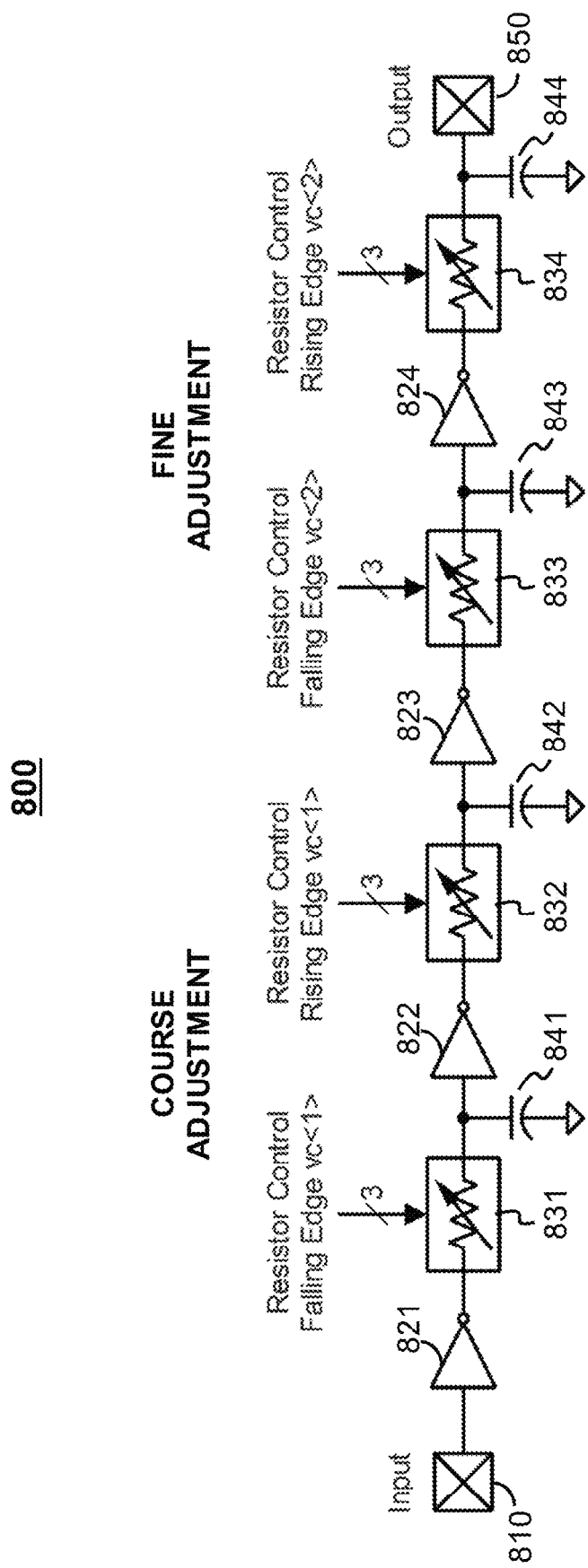
FIG. 8 illustrates an exemplary delay circuit in the exemplary LO generator shown in FIG. 3, 4, or 5, according to some embodiments of the present disclosure.

FIG. 8 illustrates an exemplary delay circuit 800 for the exemplary LO generator shown in FIG. 3, 4, or 5, according to some embodiments of the present disclosure. Delay circuit 800 includes an input 810, an amplifier 821, a variable resistor 831, a capacitor 841, an amplifier 822, a variable resistor 832, a capacitor 842, an amplifier 823, a variable resistor 833, a capacitor 843, an amplifier 824, a variable resistor 834, a capacitor 844, and an output 850 coupled as illustrated in FIG. 8. Variable resistors 831, 832, 833, and 834 respectively receive a resistor control falling edge vc <1> (hereinafter referred to as "Ctrl_FE1"), a resistor control raising edge vc<1> (hereinafter referred to as "Ctrl_RE1"), a resistor control falling edge <2> (hereinafter referred to as "Ctrl_FE2"), and a resistor control raising edge <2> (hereinafter referred to as "Ctrl_RE2") signals to adjust their resistances, thereby changing the delay time of delay circuit 800.

As illustrated in FIG. 8, Ctrl_FE1, Ctrl_RE1, Ctrl_FE2, and Ctrl_RE2 each have, for example, three bits to adjust the resistance. The three-bit value can be set as "000" to provide a minimum time delay, and as "111" to provide a maximum time delay. In some embodiments, the three-bit value can be initially set as "100" to provide adjust ranges for a time advance by reducing the delay time, and a time delay by increasing the delay time.

Resistors 831, 832, 833, and 834 can be of resistances of sub-kilo ohm. For example, resistors 831 and 832 have resistances of 250 ohm with a linear track. Resistors 833 and 834 have resistances of 20 ohm with a linear track. Capacitors 841 and 842 have 0.5 microfarads (μF). Capacitors 843 and 844 have 0.1 μF. In accordance with these exemplary resistances and capacitors, Ctrl_FE1 and Ctrl_RE1 can be configured to perform a coarse adjustment of the delay time. On the other hand, Ctrl_FE1 and Ctrl_RE1 can be configured to perform a fine adjustment of the delay time.

The IQ imbalance calibration by delay circuit 800 is achieved by digital calibration. For example, a controller or processor can control the calibration and calibration amounts in digital circuits to achieve the IQ imbalance calibration. In some embodiments, the controller and processor can execute a program to perform the IQ imbalance calibration methods in FIGS. 3-15.

Figure 9:
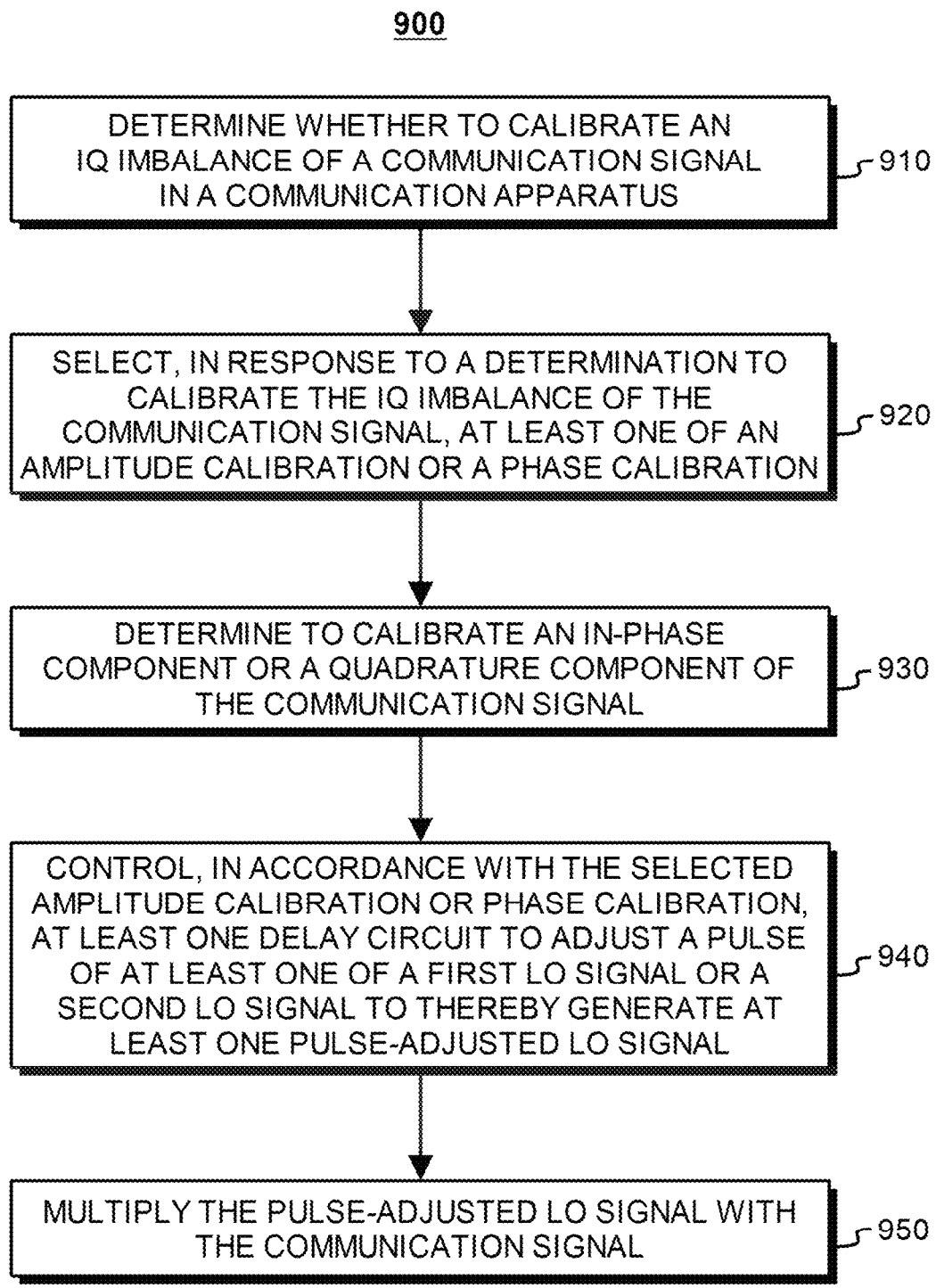
FIG. 9 illustrates an exemplary method for IQ imbalance calibration, according to some embodiments of the present disclosure.

FIG. 9 illustrates an exemplary method 900 for calibrating the IQ imbalance, according to some embodiments of the present disclosure. Method 900 may be practiced by apparatus 200, receiver 300 or system 400. Method 900 includes determining whether to calibrate an IQ imbalance of a communication signal in a communication apparatus (step 910), selecting, in response to a determination to calibrate the IQ imbalance of the communication signal, at least one of an amplitude calibration or a phase calibration (step 920), determine to calibrate an in-phase component or a quadrature component of the communication signal (step 930), controlling, in accordance with the selected amplitude calibration or phase calibration, at least one delay circuit to adjust a pulse of at least one of a first LO signal or a second LO signal to thereby generate at least one pulse-adjusted LO signal (step 940), and multiplying the pulse-adjusted LO signal with the communication signal (step 950).

Step 910 includes determining whether to calibrate an IQ imbalance of a communication signal in a communication apparatus. For example, processor 260 is configured to execute instructions stored in memory 280 to cause apparatus 200 to measure an image-response rejection ratio (IMRR) in a communication signal received from transceiver 220. For example, processor 260 can be configured to cause apparatus 200 to measure the IMRR in accordance with:

$$IMRR = \frac{\gamma^2 + 1 + 2\gamma\cos(\phi)}{\gamma^2 + 1 - 2\gamma\cos(\phi)} \approx \frac{\epsilon^2 + \phi^2}{4} \quad (9)$$

where γ is a amplitude imbalance, $\epsilon = \gamma - 1$, and φ is a phase imbalance.

Processor 260 is also configured to execute the instructions to cause apparatus 200 to compare the IMRR with a threshold. The threshold can be, for example, −50 dB. If the measured IMRR exceeds the threshold, processor 260 is configured to execute the instructions to cause apparatus 200 to determine to calibrate the IQ imbalance of the communication signal.

In some embodiments, processor 260 is configured to execute the instructions to cause apparatus 200 to compare the IMRR with two thresholds. The thresholds can be, for example, −45 dB and −50 dB. If the measured IMRR exceeds the first threshold, e.g., −45 dB, processor 260 is also configured to execute the instructions to cause apparatus 200 to compare the IMRR with the second threshold, e.g., −50 dB. If the measured IMRR exceeds the second threshold, processor 260 is configured to execute the instructions to cause apparatus 200 to determine to calibrate the IQ imbalance of the communication signal. Apparatus 200 may be able to deal with its hysteresis accordingly.

Transceiver 220, baseband processing and control 360, RF Macro Main IIC 430, IFPP 450, or processor 460 can also be configured to perform step 910 as described above for processor 260.

Step 920 includes selecting, in response to a determination to calibrate the IQ imbalance of the communication signal, at least one of an amplitude calibration or a phase calibration. For example, processor 260 is configured to execute instructions stored in memory 280 to cause apparatus 200 to calculate an amplitude imbalance Δ as equation (2) and a phase imbalance φ as equation (8) in the communication signal. Processor 260 is then configured to execute instructions to cause apparatus 200 to compare the amplitude Δ with the phase imbalance ϕ. If the amplitude Δ exceeds the phase imbalance ϕ, processor 260 is configured to execute instructions to cause apparatus 200 to select the amplitude calibration. If the amplitude Δ does not exceed the phase imbalance ϕ, processor 260 is configured to execute instructions to cause apparatus 200 to select the phase calibration.

Transceiver 220, baseband processing and control 360, RF Macro Main IIC 430, IFPP 450, or processor 460 can also be configured to perform step 920 as described above for processor 260.

Step 930 includes determining to calibrate an in-phase component or a quadrature component of the communication signal. For example, processor 260 is configured to execute instructions stored in memory 280 to cause apparatus 200 to obtain a calibration range of the in-phase component and a calibration range of the quadrature component. For example, processor 260 is configured to execute instructions to cause apparatus 200 to obtain three-bit values of Ctrl_FE1, Ctrl_RE1, Ctrl_FE2, and Ctrl_RE2 in delay circuit 800. When initial values of Ctrl_FE1, Ctrl_RE1, Ctrl_FE2, and Ctrl_RE2 are "100," respectively, processor 260 is configured to execute instructions to cause apparatus 200 to calculate and sum up adjustable ranges of these control signals in delay circuits for in-phase digital LO adjust signals and quadrature digital LO adjust signals.

For example, the LO signals $f_{LO,I+}(t)$, $f_{LO,I-}(t)$, $f_{LO,Q+}(t)$, and $f_{LO,Q-}(t)$ in FIG. 6(B) can be respectively adjusted by digital LO adjust signals LO_I$_+$(t), LO_I$_-$(t), LO_Q$_+$(t), and LO_Q$_-$(t) through four individual instances of delay circuit 800. Processor 260 is configured to execute instructions to cause apparatus 200 to calculate and sum up adjustable ranges of these control signals in those four delay circuits for the digital LO adjust signals LO_I$_+$(t), LO_I$_-$(t), LO_Q$_+$(t), and LO_Q$_-$(t). When a three-bit value of a control signal is closer to its initial value, e.g., "100," the control signal's adjustable range is larger. After processor 260 is configured to calculate and sum up adjustable ranges of these control signals for the in-phase component and the quadrature component, processor 260 is further configured to execute instructions to cause apparatus 200 to determine to calibrate the in-phase component of the communication signal if the calibration range of the in-phase component exceeds the calibration range of the quadrature component. Alternatively, processor 260 is further configured to execute instructions to cause apparatus 200 to determine to calibrate the quadrature component of the communication signal if the calibration range of the in-phase component does not exceed the calibration range of the quadrature component.

In some embodiments, processor 260 can be further configured to execute instructions to cause apparatus 200 to determine to calibrate the in-phase component of the communication signal if the calibration range of the in-phase component does not exceed the calibration range of the quadrature component. Alternatively, processor 260 can be further configured to execute instructions to cause apparatus 200 to determine to calibrate the quadrature component of the communication signal if the calibration range of the in-phase component exceeds the calibration range of the quadrature component.

In response to a determination to calibrate the in-phase component of the communication signal, processor 260 is configured to execute instructions to cause apparatus 200 to control the two delay circuits for the digital LO adjust signals LO_I$_+$(t) and LO_I$_-$(t) to adjust a pulse of the LO signals $f_{LO,I+}(t)$ and $f_{LO,I-}(t)$.

A mixer in transceiver 220 is configured to multiply the pulse-adjusted LO signals $f_{LO,I+}(t)$ and $f_{LO,I-}(t)$ with the in-phase component of the communication signal x(t).

In response to a determination to calibrate the quadrature component of the communication signal, processor 260 is configured to execute instructions to cause apparatus 200 to control the two delay circuits for the digital LO adjust signals LO_Q$_+$(t) and LO_Q$_-$(t) to adjust a pulse of the LO signals $f_{LO,Q+}(t)$ and $f_{LO,Q-}(t)$.

Another mixer in transceiver 220 is configured to multiply the pulse-adjusted LO signals $f_{LO,Q+}(t)$ and $f_{LO,Q-}(t)$ with the quadrature component of the communication signal x(t).

Transceiver 220, baseband processing and control 360, RF Macro Main IIC 430, IFPP 450, or processor 460 can also be configured to perform step 930 as described above for processor 260.

Step 940 includes controlling, in accordance with the selected amplitude calibration or phase calibration, at least one delay circuit to adjust a pulse of at least one of a first LO signal or a second LO signal to thereby generate at least one pulse-adjusted LO signal. For example, when apparatus 200 selects to calibrate the amplitude imbalance, processor 260 is configured to execute instructions stored in memory 280 to cause apparatus 200 to determine if a magnitude of the in-phase component of the communication signal exceeds a magnitude of the quadrature component of the communication signal, e.g., whether |I|−|Q|>0 is true.

If apparatus 200 determines the magnitude of the in-phase component of the communication signal exceeds the magnitude of the quadrature component of the communication signal, apparatus 200 is configured to determine to calibrate the in-phase component or the quadrature component of the communication signal as described above in step 930.

When apparatus 200 determines to calibrate the in-phase component of the communication signal, processor 260 is configured to execute instructions to cause apparatus 200 to control the two delay circuits for the digital LO adjust signals LO_I$_+$(t) and LO_I$_-$(t) to squeeze the pulse of the LO signals $f_{LO,I+}(t)$ and $f_{LO,I-}(t)$. Alternatively, when apparatus 200 determines to calibrate the quadrature component of the communication signal, processor 260 is configured to execute instructions to cause apparatus 200 to control the two delay circuits for the digital LO adjust signals LO_Q$_+$(t) and LO_Q$_-$(t) to expand the pulse of the LO signals $f_{LO,Q+}(t)$ and $f_{LO,Q-}(t)$.

If apparatus 200 determines the magnitude of the in-phase component of the communication signal does not exceed the magnitude of the quadrature component of the communication signal, apparatus 200 is configured to determine to calibrate the in-phase component or the quadrature component of the communication signal as described above in step 930.

When apparatus 200 determines to calibrate the in-phase component of the communication signal, processor 260 is configured to execute instructions to cause apparatus 200 to control the two delay circuits for the digital LO adjust signals LO_I$_-$(t) to expand the pulse of the LO signals $f_{LO,I+}(t)$ and $f_{LO,I-}(t)$. Alternatively, when apparatus 200 determines to calibrate the quadrature component of the communication signal, processor 260 is configured to execute instructions to cause apparatus 200 to control the two delay circuits for the digital LO adjust signals LO_Q$_+$(t) and LO_Q$_-$(t) to squeeze the pulse of the LO signals $f_{LO,Q+}(t)$ and $f_{LO,Q-}(t)$.

In some embodiments, processor 260 is configured to execute instructions to cause apparatus 200 to control a delay circuit to squeeze a pulse of an LO signal by adjusting a rising edge of the pulse with a time delay and a falling edge of the pulse with a time advance. Processor 260 is configured to execute instructions to cause apparatus 200 to control the delay circuit to expand the pulse of the LO signal by adjusting the rising edge of the pulse with another time advance and the falling edge of the pulse with another time delay.

In some embodiments, when apparatus 200 controls the delay circuit to squeeze the pulse of the LO signal, processor 260 is configured to execute instructions to cause apparatus 200 to determine the time delay of the rising edge of the pulse and the time advance of the falling edge in accordance with the magnitude of the in-phase component and the magnitude of the quadrature component of the communication signal. For example, when the difference between the magnitude of the in-phase component and the magnitude of the quadrature component of the communication signal is large, apparatus 200 determines a larger time delay of the rising edge of the pulse and a larger time advance of the falling edge to squeeze the pulse more. In contrast, when the difference between the magnitude of the in-phase component and the magnitude of the quadrature component of the communication signal is not large, apparatus 200 determines a small time delay of the rising edge of the pulse and a small time advance of the falling edge to slightly squeeze the pulse.

When apparatus 200 controls the delay circuit to expand the pulse of the LO signal, processor 260 is configured to execute instructions to cause apparatus 200 to determine the another time advance of the rising edge of the pulse and the another time delay of the falling edge in accordance with the magnitude of the in-phase component and the magnitude of the quadrature component of the communication signal. For example, when the difference between the magnitude of the in-phase component and the magnitude of the quadrature component of the communication signal is large, apparatus 200 determines a larger another time advance of the rising edge of the pulse and a larger time delay of the falling edge to expand the pulse more. In contrast, when the difference between the magnitude of the in-phase component and the magnitude of the quadrature component of the communication signal is not large, apparatus 200 determines a small another time advance of the rising edge of the pulse and a small time delay of the falling edge to slightly expand the pulse.

Alternatively, when apparatus 200 selects to calibrate the phase imbalance, processor 260 is configured to execute instructions stored in memory 280 to cause apparatus 200 to determine if a phase imbalance in the communication signal exceeds zero, e.g., whether $\varphi>0$ is true.

If apparatus 200 determines that the phase imbalance in the communication signal exceeds zero, e.g., $\varphi>0$, apparatus 200 is configured to calibrate the in-phase component or the quadrature component of the communication signal, as described above in step 930.

When apparatus 200 determines to calibrate the in-phase component of the communication signal, processor 260 is configured to execute instructions to cause apparatus 200 to control the two delay circuits for the digital LO adjust signals $LO\_I_+(t)$ and $LO\_I_-(t)$ to time shift the pulse of the LO signals $f_{LO,I+}(t)$ and $f_{LO,I-}(t)$ with a time advance. Alternatively, when apparatus 200 determines to calibrate the quadrature component of the communication signal, processor 260 is configured to execute instructions to cause apparatus 200 to control the two delay circuits for the digital LO adjust signals $LO\_Q_+(t)$ and $LO\_Q_-(t)$ to time shift the pulse of the LO signals $f_{LO,Q+}(t)$ and $f_{LO,Q-}(t)$ with a time delay.

If apparatus 200 determines that the phase imbalance in the communication signal does not exceed zero, e.g., $\varphi<0$, apparatus 200 is configured to determine to calibrate the in-phase component or the quadrature component of the communication signal as described above in step 930.

When apparatus 200 determines to calibrate the in-phase component of the communication signal, processor 260 is configured to execute instructions to cause apparatus 200 to control the two delay circuits for the digital LO adjust signals $LO\_I_+(t)$ and $LO\_I_-(t)$ to time shift the pulse of the LO signals $f_{LO,I+}(t)$ and $f_{LO,I-}(t)$ with a time delay. Alternatively, when apparatus 200 determines to calibrate the quadrature component of the communication signal, processor 260 is configured to execute instructions to cause apparatus 200 to control the two delay circuits for the digital LO signals $LO\_Q_+(t)$ and $LO\_Q_-(t)$ to time shift the pulse of the LO signals $f_{LO,Q+}(t)$ and $f_{LO,Q-}(t)$ with a time advance.

In some embodiments, processor 260 is configured to execute instructions to cause apparatus 200 to control a delay circuit to time shift a pulse of an LO signal with a time advance by adjusting a rising edge and a falling edge of the pulse with the time advance. Processor 260 is configured to execute instructions to cause apparatus 200 to control the delay circuit to time shift the pulse of the LO signal with a time delay by adjusting the rising edge and the falling edge of the pulse with the time delay.

In some embodiments, when apparatus 200 controls the delay circuit to time shift the pulse of the LO signal with the time advance, processor 260 is configured to execute instructions to cause apparatus 200 to determine the time advance of the rising edge and falling edge of the pulse in accordance with the phase imbalance in the communication signal. For example, when the phase imbalance is larger than zero more, apparatus 200 determines a larger time advance of the rising edge and falling edge to time shift the pulse with more time advance. In contrast, when the phase imbalance is larger than zero less, apparatus 200 determines a small time advance of the rising edge and falling edge of the pulse to slightly time shift the pulse with less time advance.

When apparatus 200 controls the delay circuit to time shift the pulse of the LO signal with the time delay, processor 260 is configured to execute instructions to cause apparatus 200 to determine the time delay of the rising edge and falling edge of the pulse in accordance with the phase imbalance in the communication signal. For example, the phase imbalance is larger than zero more, apparatus 200 determines a larger time delay of the rising edge and falling edge of the pulse to time shift the pulse with more time delay. In contrast, when the phase imbalance is not much larger than zero, apparatus 200 determines a small time delay of the rising edge and falling edge of the pulse to slightly time shift the pulse with less time delay.

Step 950 includes multiplying the pulse-adjusted LO signal with the communication signal. For example, a mixer in transceiver 220 is configured to multiply the pulse-adjusted LO signals $f_{LO,i+}(t)$ and $f_{LO,I-}(t)$ with the in-phase component of the communication signal x(t). Alternatively, another mixer in transceiver 220 is configured to multiply the pulse-adjusted LO signals $f_{LO,Q+}(t)$ and $f_{LO,Q-}(t)$ with the quadrature component of the communication signal x(t).

In some embodiments, processor 260 can be configured to execute the instructions to cause communication apparatus 200 to control a delay circuit to adjust a pulse of at least one of the first LO signal or the second LO signal by adjusting a delay time of the delay circuit by adjusting a resistance of the delay circuit. For example, processor 260 is configured to cause apparatus 200 to adjust variable resistors 831, 832, 833, and 834 to adjust delay time of two instances of delay circuit 800 for the digital LO signals LO_I$_+$(t) and LO_I$_-$(t). Apparatus 200 can adjust the variable resistors to calibrate the IQ imbalance.

In some embodiments, the delay circuit discussed above includes a first variable resistor coupled to a first capacitor, and a second variable resistor coupled to a second capacitor. For example, delay circuit 800 includes resistor 831 coupled to capacitor 841, and resistor 832 coupled to capacitor 842.

In some embodiments, the delay circuits for the in-phase time delay and the quadrature time delay can be part of a delay circuit component. For example, a delay circuit component in communication apparatus 200 includes an in-phase delay circuit and a quadrature delay circuit for the above steps of method 900, or two in-phase delay circuits and two quadrature delay circuits for the above steps of method 900.

In some embodiments, processor 260 can be configured to execute the instructions to cause communication apparatus 200 to determine whether to calibrate the IQ imbalance of the communication signal periodically. For example, processor 260 can be configured to determine whether to calibrate the IQ imbalance of the communication signal every 100 microseconds (ms).

Figure 10:
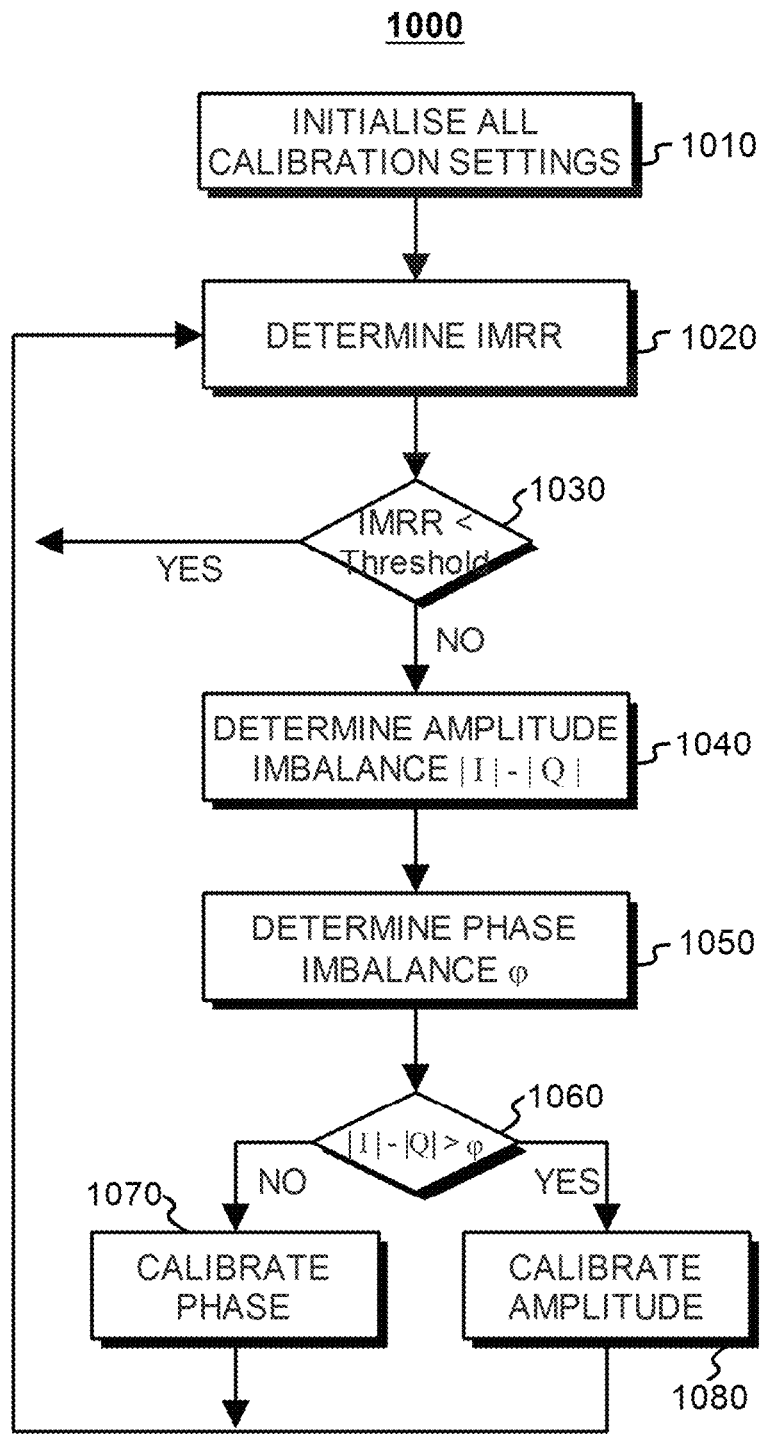
FIG. 10 illustrates an exemplary method for IQ imbalance calibration, according to some embodiments of the present disclosure.

FIG. 10 illustrates an exemplary method 1000 for IQ imbalance calibration, according to some embodiments of the present disclosure. Method 1000 may be practiced by apparatus 200, receiver 300 or system 400. Method 1000 includes initializing all calibration settings (step 1010), determining an IMRR (step 1020), determining whether IMRR exceeds a threshold (step 1030), determining an amplitude imbalance (step 1040), determining a phase imbalance (step 1050), determining whether the amplitude imbalance exceeds the phase imbalance (step 1060), calibrating phase (step 1070), and calibrating amplitude (step 1080).

Step 1010 includes initializing all calibration settings. For example, processor 260 is configured to initialize these three bits of Ctrl_FE1, Ctrl_RE1, Ctrl_FE2, and Ctrl_RE2 in delay circuit 800 as "100" for all of these control signals.

Step 1020 includes determining an IMRR. As illustrated above in step 910, processor 260, for example, can be configured to determine the IMRR of the communication signal.

Step 1030 includes determining whether IMRR exceeds a threshold. After determining the IMRR, processor 260 can be configured to compare the IMRR and a threshold or two thresholds as illustrated above in step 910. If processor 260 determines IMRR<threshold, processor 260 may determine not to calibrate the IQ imbalance. If processor 260 determines IMRR>threshold, processor 260 may determine to calibrate the IQ imbalance and proceed to step 1040.

Step 1040 includes determining an amplitude imbalance in the communication signal. For example, processor 260 can be configured to determining an amplitude imbalance as equation (2).

Step 1050 includes determining a phase imbalance. For example, processor 260 can also be configured to determine a phase imbalance as illustrated above in equation (8).

Step 1060 includes determining whether the amplitude imbalance exceeds the phase imbalance. For example, processor 260 can be configured to determine whether the amplitude imbalance from step 1040 exceeds the phase imbalance from step 1050. If the amplitude imbalance does not exceed the phase imbalance, method 1000 will proceed to step 1070 for calibrating phase. If the amplitude imbalance exceeds the phase imbalance, method 1000 will proceed to step 1080 for calibrating amplitude.

Step 1070 includes calibrating phase. For example, processor 260 can be configured to perform step 940 of method 900 in FIG. 9 or method 1100 in FIG. 11 to calibrate the phase imbalance.

Step 1080 includes calibrating amplitude. For example, processor 260 can be configured to perform step 940 of method 900 in FIG. 9 or method 1300 in FIG. 13 to calibrate the amplitude imbalance.

After step 1070 or 1080 is completed, processor 260 may be configured to perform step 1020 as a new iteration for calibrating IQ imbalance.

Transceiver 220 baseband processing and control 360, RF Macro Main IIC 430, IFPP 450, or processor 460 can also be configured to perform all or part of steps of method 1000 as described above for processor 260.

Figure 11:
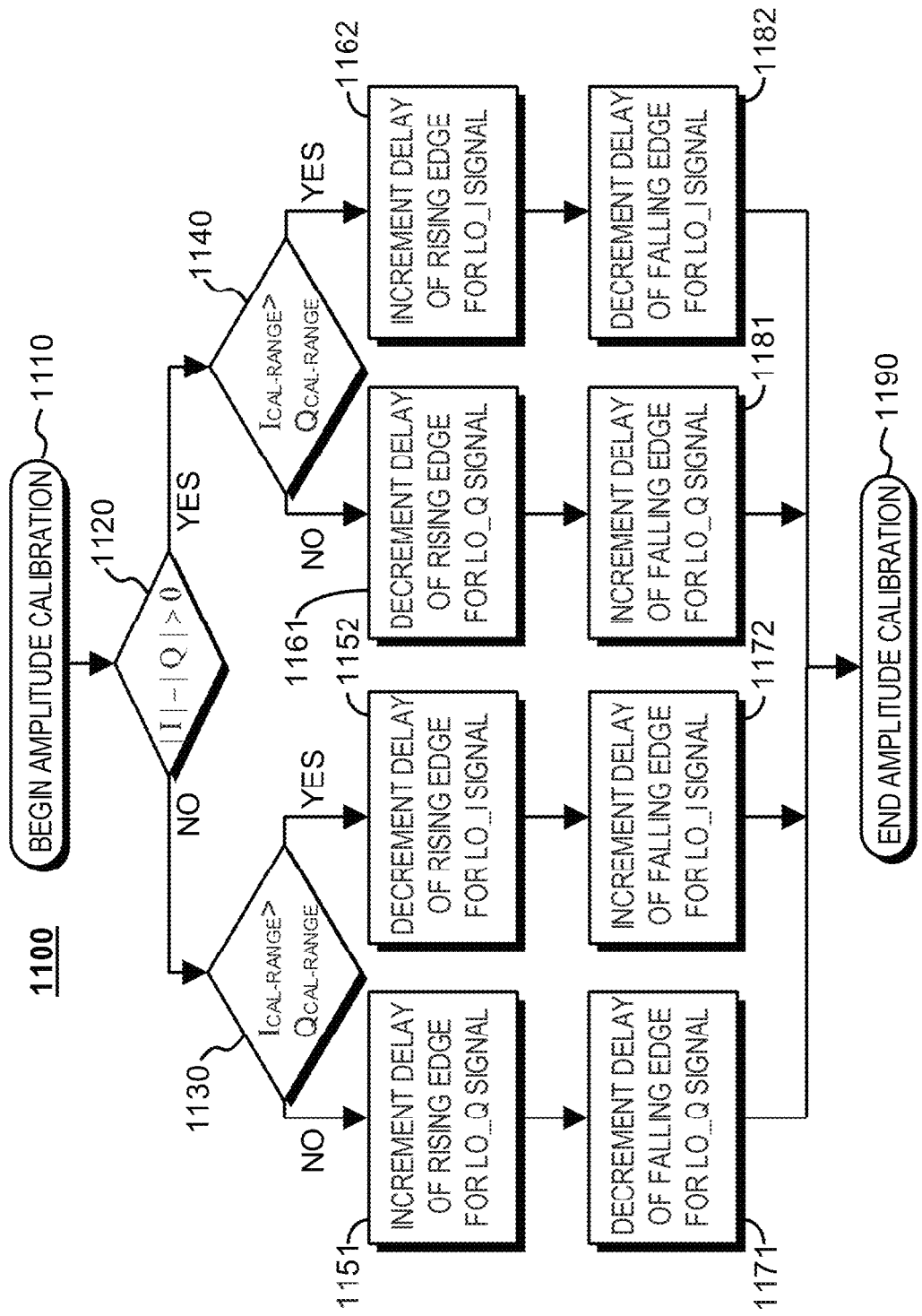
FIG. 11 illustrates an exemplary method for amplitude calibration, according to some embodiments of the present disclosure.

FIG. 11 illustrates an exemplary method 1100 for amplitude calibration, according to some embodiments of the present disclosure. Method 1100 may be practiced by apparatus 200, receiver 300 or system 400. Method 1100 includes beginning amplitude calibration (step 1110), determine whether a magnitude of an in-phase component of a communication signal exceeds a magnitude of a quadrature component of the communication signal (step 1120), determine if a calibration range of the in-phase component exceeds a calibration range of the quadrature component (step 1130), determine if a calibration range of the in-phase component exceeds a calibration range of the quadrature component (step 1140), incrementing time delay of a rising edge of a pulse of a digital LO adjust signal for the quadrature component (step 1151), decrementing time delay of a rising edge of a pulse of a digital LO adjust signal for the in-phase component (step 1152), decrementing time delay of a rising edge of a pulse of a digital LO adjust signal for the quadrature component (step 1161), incrementing time delay of a rising edge of a pulse of a digital LO signal for the in-phase component (step 1162), decrementing time delay of a falling edge of a pulse of a digital LO signal for the quadrature component (step 1171), incrementing time delay of a falling edge of a pulse of a digital LO adjust signal for the in-phase component (step 1172), incrementing time delay of a falling edge of a pulse of a digital LO signal for the quadrature component (step 1181), decrementing time delay of a falling edge of a pulse of a digital LO adjust signal for the in-phase component (step 1182), and ending amplitude calibration (step 1190).

Step 1110 includes beginning amplitude calibration. For example, processor 260 can be configured to execute step 1110 to initialize control signals of delay circuits as "100." Processor 260 can also be configured to, for example, reset all registers of processor 260.

Step 1120 includes determining whether a magnitude of an in-phase component of a communication signal exceeds a magnitude of a quadrature component of the communication signal. For example, processor 260 can be configured to determine the magnitude of the in-phase component of the communication signal exceeds the magnitude of the quadrature component of the communication signal. If the magnitude of the in-phase component does not exceed the magnitude of the quadrature component, processor 260 can be configured to proceed to step 1130. If the magnitude of the in-phase component exceeds the magnitude of the quadrature component, processor 260 can be configured to proceed to step 1140.

Step 1130 includes determining if a calibration range of the in-phase component exceeds a calibration range of the quadrature component. For example, processor 260 can be configured to determine if the calibration range of the in-phase component does not exceed the calibration range of the quadrature component, processor 260 is configured to perform steps 1151 and 1171 to squeeze a pulse of a digital LO adjust signal for the quadrature component. If the calibration range of the in-phase component exceeds the calibration range of the quadrature component, processor 260 is configured to perform steps 1152 and 1172 to expand a pulse of a digital LO adjust signal for the in-phase component.

Step 1140 includes determining if a calibration range of the in-phase component exceeds a calibration range of the quadrature component. For example, processor 260 can be configured to determine if the calibration range of the in-phase component does not exceed the calibration range of the quadrature component, processor 260 is configured to perform steps 1161 and 1181 to expand a pulse of a digital LO adjust signal for the quadrature component. If the calibration range of the in-phase component exceeds the calibration range of the quadrature component, processor 260 is configured to perform steps 1162 and 1182 to squeeze a pulse of a digital LO adjust signal for the in-phase component.

Step 1151 includes incrementing time delay of a rising edge of a pulse of a digital LO adjust signal for the quadrature component. For example, processor 260 can be configured to adjust resistances of an instance of delay circuit 800 to increment time delay of a rising edge of a pulse of a digital LO adjust signal LO_Q(t) for the quadrature component. The instance of delay circuit 800 is, for example, a quadrature delay circuit.

Step 1152 includes decrementing time delay of a rising edge of a pulse of a digital LO adjust signal for the in-phase component. For example, processor 260 can be configured to adjust resistances of another instance of delay circuit 800 to decrement time delay of a rising edge of a pulse of a digital LO adjust signal LO_I(t) for the in-phase component. The another instance of delay circuit 800 is, for example, an in-phase delay circuit.

Step 1161 includes decrementing time delay of a rising edge of a pulse of a digital LO adjust signal for the quadrature component. For example, processor 260 can be configured to adjust resistances of another instance of delay circuit 800 to decrement time delay of a rising edge of a pulse of the digital LO adjust signal LO_Q(t) for the quadrature component. The another instance of delay circuit 800 is, for example, the quadrature delay circuit.

Step 1162 includes incrementing time delay of the rising edge of the pulse of a digital LO adjust signal for the in-phase component. For example, processor 260 can be configured to adjust resistances of another instance of delay circuit 800 to increment time delay of a rising edge of a pulse of the digital LO adjust signal LO_I(t) for the in-phase component. The another instance of delay circuit 800 is, for example, the in-phase delay circuit.

Step 1171 includes decrementing time delay of a falling edge of a pulse of a digital LO adjust signal for the quadrature component. For example, processor 260 can be configured to adjust resistances of an instance of delay circuit 800 to decrement time delay of the falling edge of the pulse of the digital LO adjust signal LO_Q(t) for the quadrature component. The instance of delay circuit 800 is, for example, the quadrature delay circuit.

Step 1172 includes incrementing time delay of the falling edge of the pulse of a digital LO adjust signal for the in-phase component. For example, processor 260 can be configured to adjust resistances of another instance of delay circuit 800 to increment time delay of the falling edge of the pulse of a digital LO adjust signal LO_I(t) for the in-phase component. The another instance of delay circuit 800 is, for example, the in-phase delay circuit.

Step 1181 includes incrementing time delay of the falling edge of the pulse of a digital LO adjust signal for the quadrature component. For example, processor 260 can be configured to adjust resistances of another instance of delay circuit 800 to increment time delay of the falling edge of the pulse of the digital LO adjust signal LO_Q(t) for the quadrature component. The another instance of delay circuit 800 is, for example, the quadrature delay circuit.

Step 1182 includes decrementing time delay of the falling edge of the pulse of a digital LO adjust signal for the in-phase component. For example, processor 260 can be configured to adjust resistances of another instance of delay circuit 800 to decrement time delay of the falling edge of the pulse of a digital LO adjust signal LO_Q(t) for the in-phase component. The another instance of delay circuit 800 is, for example, the in-phase delay circuit.

Step 1190 ending amplitude calibration of method 1100. For example, processor 260 is configured to end the amplitude calibration.

All incrementing or decrementing time delay in method 1100 can be incrementing or decrementing 1, 2, 3, . . . n−1, where n is $2^b$, and b is a bit width of a control signal for a delay circuit. When a large amount of amplitude imbalance is measured, processor 260 is configured to determine a large amount of amplitude calibration. The amplitude calibration can be started with a large amount of calibration in the first iteration, and with a small amount of calibration at the following iterations. It can be helpful to improve convergence of the calibration.

In some embodiments, the in-phase calibration and the quadrature calibration in method 1100 can be performed alone or at the same time.

Transceiver 220, baseband processing and control 360, RF Macro Main IIC 430, IFPP 450, or processor 460 can also be configured to perform all or part of steps of method 1100 as described above for processor 260.

Figure 12:
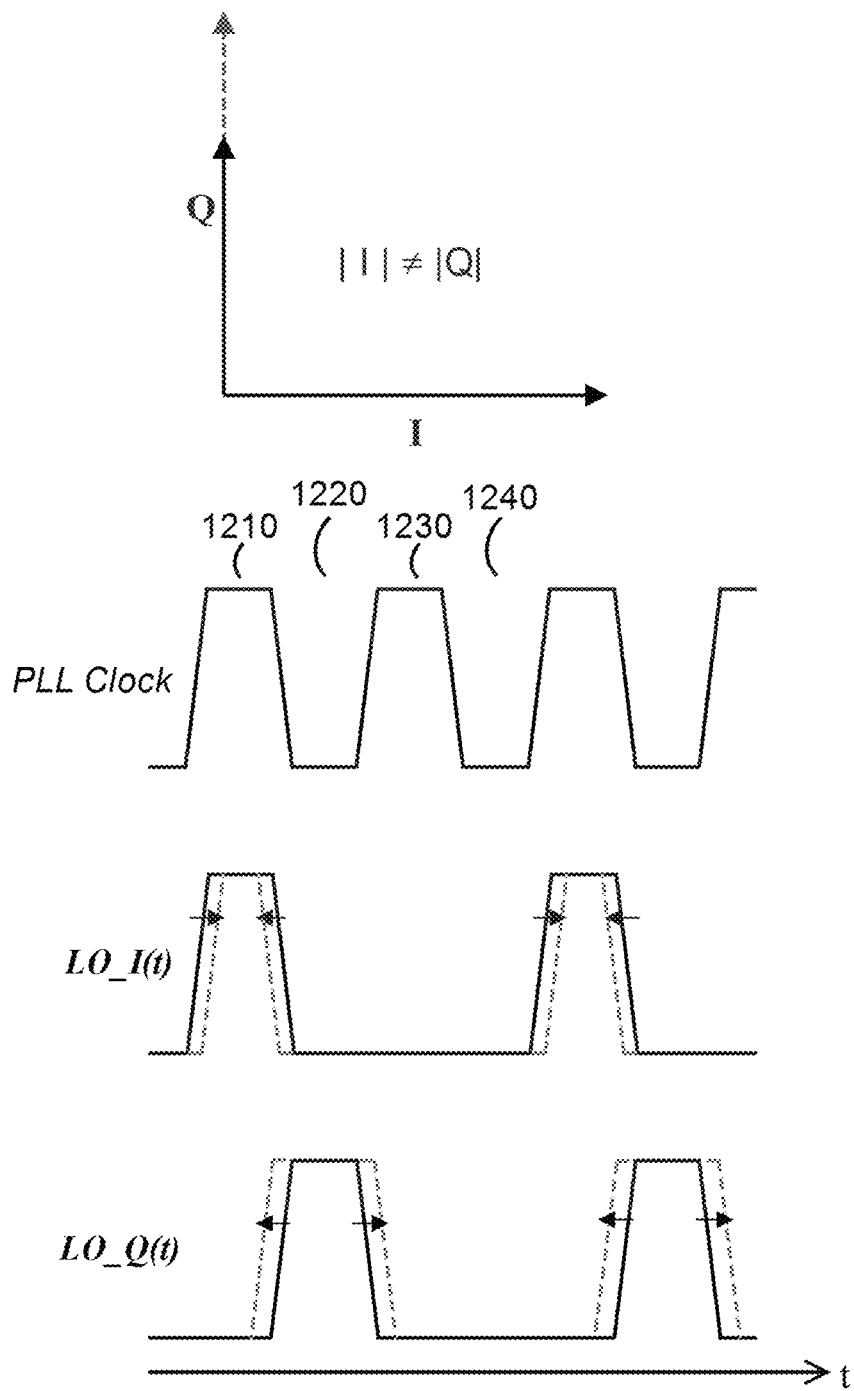
FIG. 12 illustrates exemplary digital LO adjust signals for amplitude calibration, according to some embodiments of the present disclosure.

FIG. 12 illustrates exemplary adjusted LO signals for amplitude calibration, according to some embodiments of the present disclosure. As shown in FIG. 12, an amplitude imbalance exists between an in-phase component and a quadrature component of a communication signal. The in-phase amplitude exceeds the quadrature amplitude. For example, as noted above in FIG. 11, processor 260 of apparatus 200 can be configured to perform steps 1162 and 1182 to squeeze a pulse of a digital LO adjust signal LO_I(t) for the in-phase component, as illustrated in FIG. 12. Alternatively, processor 260 of apparatus 200 can be configured to perform steps 1161 and 1181 to expand a pulse of a digital LO adjust signal LO_Q(t) for the quadrature component, as illustrated in FIG. 12.

Figure 13:
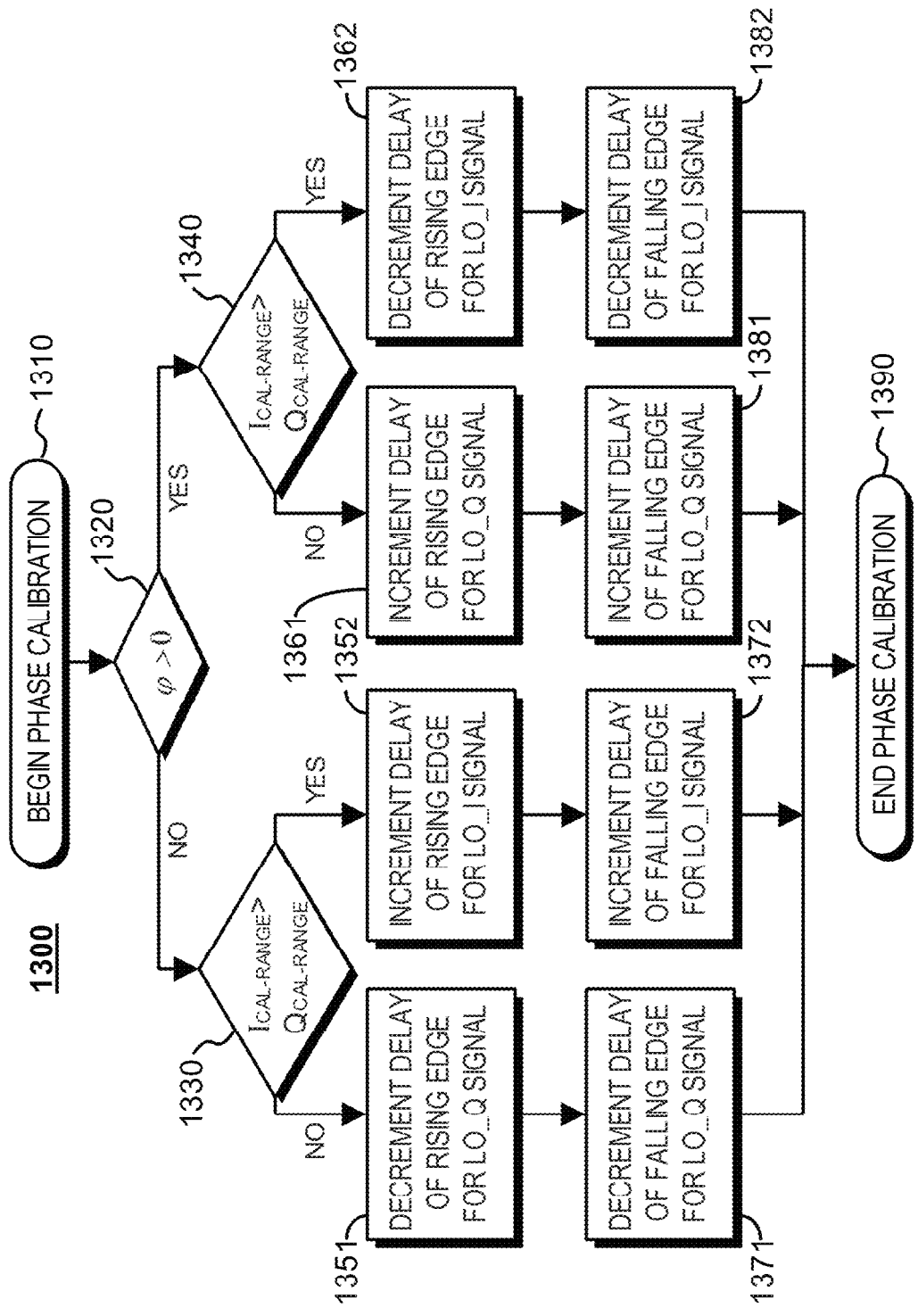
FIG. 13 illustrates an exemplary method for phase calibration, according to some embodiments of the present disclosure.

FIG. 13 illustrates an exemplary method for phase calibration, according to some embodiments of the present disclosure. Method 1300 may be practiced by apparatus 200, receiver 300 or system 400. Method 1300 includes beginning phase calibration (step 1310), determining whether a phase imbalance exceeds zero (step 1320), determining if a calibration range of the in-phase component exceeds a calibration range of the quadrature component (step 1330), determining if a calibration range of the in-phase component exceeds a calibration range of the quadrature component (step 1340), decrementing time delay of a rising edge of a pulse of a digital LO adjust signal for the quadrature component (step 1351), incrementing time delay of a rising edge of a pulse of a digital LO adjust signal for the in-phase component (step 1352), incrementing time delay of a rising edge of a pulse of a digital LO adjust signal for an quadrature component (step 1361), decrementing time delay of a rising edge of a pulse of a digital LO adjust signal for an in-phase component (step 1362), decrementing time delay of a falling edge of a pulse of a digital LO adjust signal for the quadrature component (step 1371), incrementing time delay of a falling edge of a pulse of a digital LO adjust signal for the in-phase component (step 1372), incrementing time delay of a falling edge of a pulse of a digital LO adjust signal for the quadrature component (step 1381), decrementing time delay of a falling edge of a pulse of a digital LO adjust signal for an in-phase component (step 1382), and ending (step 1390).

Step 1310 includes beginning phase calibration. For example, processor 260 can be configured to execute step 1310 to initialize control signals of delay circuits as "100." Processor 260 can also be configured to, for example, reset all registers.

Step 1320 includes determining whether a phase imbalance exceeds zero. For example, processor 260 can be configured to determine whether the phase imbalance in the communication signal exceeds zero. If the phase imbalance does not exceed zero, processor 260 can be configured to proceed to step 1330. If the phase imbalance exceeds zero, processor 260 can be configured to proceed to step 1340.

Step 1330 includes determining if a calibration range of the in-phase component exceeds a calibration range of the quadrature component. For example, processor 260 can be configured to determine if the calibration range of the in-phase component does not exceed the calibration range of the quadrature component, processor 260 is configured to perform steps 1351 and 1371 to time shift a pulse of a digital LO adjust signal LO_Q(t) for the quadrature component with a time advance. If the calibration range of the in-phase component exceeds the calibration range of the quadrature component, processor 260 is configured to perform steps 1352 and 1372 to time shift a pulse of a digital LO adjust signal LO_I(t) for the in-phase component with a time delay.

Step 1340 includes determining if a calibration range of the in-phase component exceeds a calibration range of the quadrature component. For example, processor 260 can be configured to determine if the calibration range of the in-phase component does not exceed the calibration range of the quadrature component, processor 260 is configured to perform steps 1361 and 1381 to time shift a pulse of a digital LO adjust signal LO_Q(t) for the quadrature component with a time delay. If the calibration range of the in-phase component exceeds the calibration range of the quadrature component, processor 260 is configured to perform steps 1362 and 1382 to time shift a pulse of a digital LO adjust signal LO_I(t) for the in-phase component with a time advance.

Step 1351 includes decrementing time delay of a rising edge of a pulse of a digital LO adjust signal for a quadrature component. For example, processor 260 can be configured to adjust resistances of an instance of delay circuit 800 to decrement time delay of a rising edge of a pulse of a digital LO adjust signal LO_Q(t) for the quadrature component.

Step 1352 includes incrementing time delay of a rising edge of a pulse of a digital LO adjust signal for an in-phase component. For example, processor 260 can be configured to adjust resistances of another instance of delay circuit 800 to increment time delay of a rising edge of a pulse of a digital LO adjust signal LO_I(t) for the in-phase component.

Step 1361 includes incrementing time delay of a rising edge of a pulse of a digital LO adjust signal for a quadrature component. For example, processor 260 can be configured to adjust resistances of another instance of delay circuit 800 to increment time delay of the rising edge of the pulse of the digital LO adjust signal LO_Q(t) for the quadrature component.

Step 1362 includes decrementing time delay of a rising edge of a pulse of a digital LO adjust signal for an in-phase component. For example, processor 260 can be configured to adjust resistances of another instance of delay circuit 800 to decrement time delay of the rising edge of the pulse of the digital LO adjust signal LO_I(t) for the in-phase component.

Step 1371 includes decrementing time delay of a falling edge of the pulse of the digital LO adjust signal for the quadrature component. For example, processor 260 can be configured to adjust resistances of an instance of delay circuit 800 to decrement time delay of a falling edge of the pulse of the digital LO adjust signal LO_Q(t) for the quadrature component.

Step 1372 includes incrementing time delay of a falling edge of the pulse of the digital LO adjust signal for the in-phase component. For example, processor 260 can be configured to adjust resistances of another instance of delay circuit 800 to increment time delay of a falling edge of the pulse of a digital LO adjust signal LO_I(t) for the in-phase component.

Step 1381 includes incrementing time delay of the falling edge of the pulse of the digital LO adjust signal for the quadrature component. For example, processor 260 can be configured to adjust resistances of another instance of delay circuit 800 to increment time delay of the falling edge of the pulse of the digital LO adjust signal LO_Q(t) for the quadrature component.

Step 1382 includes decrementing time delay of the falling edge of the pulse of the digital LO adjust signal for the in-phase component. For example, processor 260 can be configured to adjust resistances of another instance of delay circuit 800 to decrement time delay of the falling edge of the pulse of the digital LO adjust signal LO_I(t) for the in-phase component.

Step 1390 includes ending phase calibration of method 1300. For example, processor 260 is configured to end the phase calibration.

Transceiver 220, baseband processing and control 360, RF Macro Main IIC 430, IFPP 450, or processor 460 can also be configured to perform all or part of steps of method 1300 as described above for processor 260.

Figure 14:
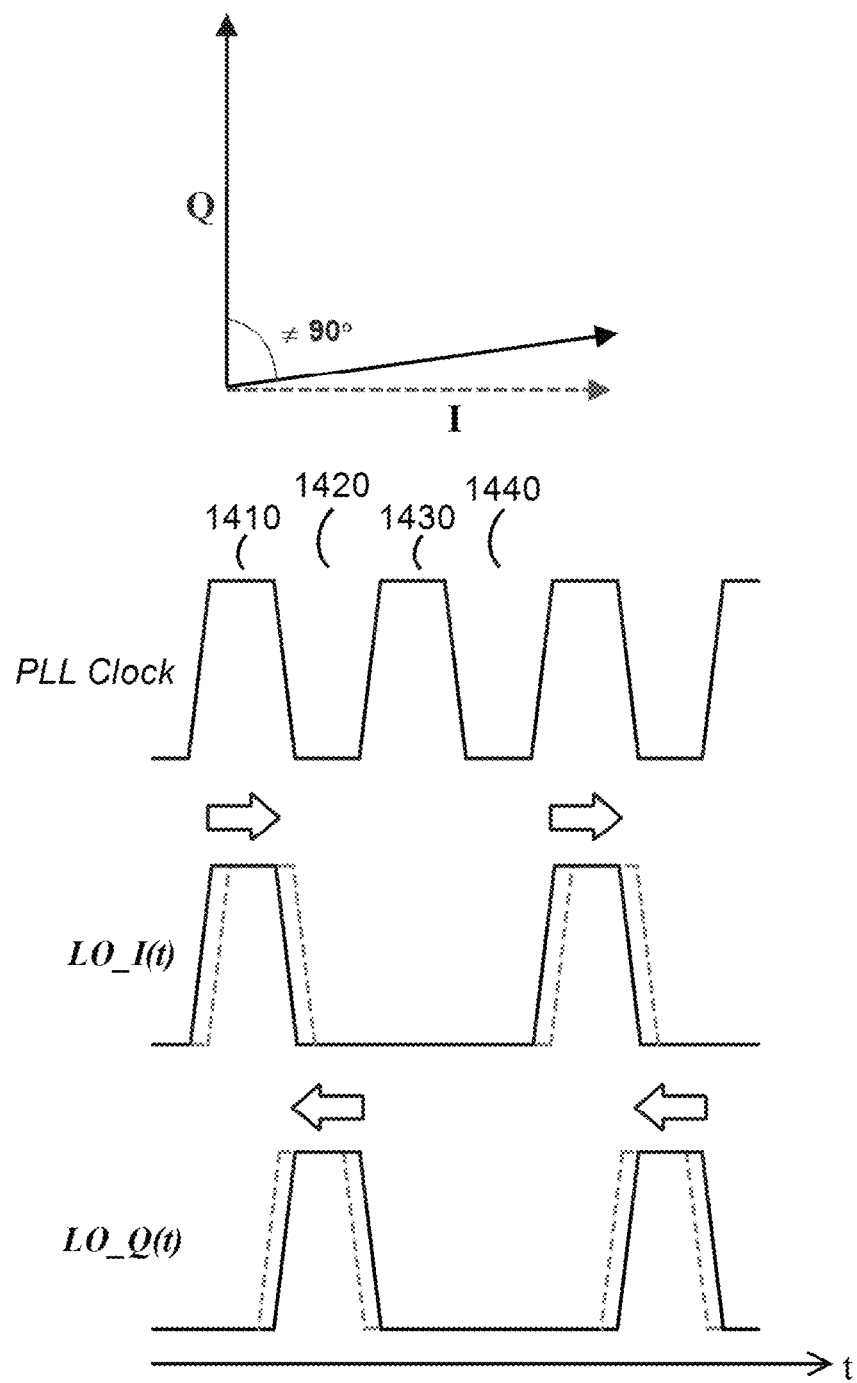
FIG. 14 illustrates exemplary digital LO adjust signals for phase calibration, according to some embodiments of the present disclosure.

FIG. 14 illustrates exemplary digital LO adjust signals for phase calibration, according to some embodiments of the present disclosure. As shown in FIG. 14, a phase imbalance exists between an in-phase component and a quadrature component of a communication signal. The phase imbalance does not exceed zero. For example, as noted above in FIG. 13, processor 260 of apparatus 200 can be configured to perform steps 1352 and 1372 to time shift a pulse of a digital LO adjust signal LO_I(t) for the in-phase component with a time delay, as illustrated in FIG. 14. Alternatively, processor 260 of apparatus 200 can be configured to perform steps 1351 and 1371 to time shift a pulse of a digital LO adjust signal LO_Q(t) for the quadrature component with a time advance, as illustrated in FIG. 14.

Figure 15:
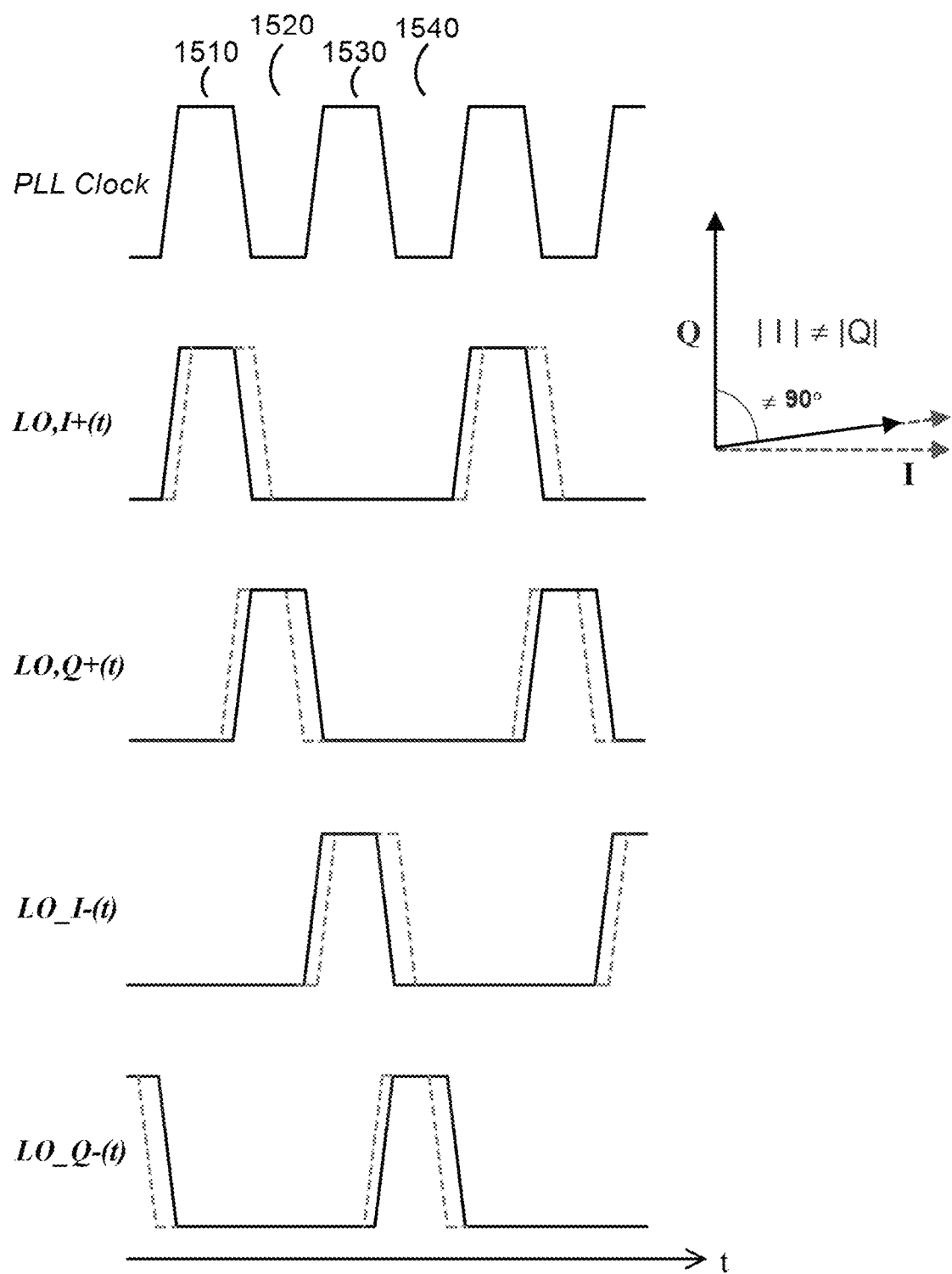
FIG. 15 illustrates exemplary digital LO adjust signals for phase calibration, according to some embodiments of the present disclosure.

FIG. 15 illustrates exemplary digital LO adjust signals for phase calibration, according to some embodiments of the present disclosure. As shown in FIG. 15, an amplitude imbalance and a phase imbalance exist between an in-phase component and a quadrature component of a communication signal. The quadrature amplitude exceeds the in-phase amplitude. For example, as noted above in FIG. 11, processor 260 of apparatus 200 can be configured to perform steps 1151 and 1171 to squeeze a pulse of digital LO adjust signals $LO\_Q_+(t)$ and $LO\_Q_-(t)$ for the quadrature component, as illustrated in FIG. 15. Alternatively, processor 260 of apparatus 200 can be configured to perform steps 1152 and 1172 to expand a pulse of digital LO adjust signals $LO\_I_+(t)$ and $LO\_I_-(t)$ for the in-phase component, as illustrated in FIG. 15.

As shown in FIG. 15, the phase imbalance does not exceed zero. For example, as noted above in FIG. 13, processor 260 of apparatus 200 can be configured to perform steps 1352 and 1372 to time shift a pulse of the digital LO adjust signals $LO\_I_+(t)$ and $LO\_I_-(t)$ for the in-phase component with a time delay, as illustrated in FIG. 15. Alternatively, processor 260 of apparatus 200 can be configured to perform steps 1351 and 1371 to time shift a pulse of the digital LO adjust signals $LO\_Q_+(t)$ and $LO\_Q_-(t)$ for the quadrature component with a time advance, as illustrated in FIG. 15.

Another aspect of the disclosure is directed to a non-transitory computer-readable medium storing instructions which, when executed, cause one or more processors to perform the methods, as discussed above. For example, instructions may be stored on a non-transitory computer-readable medium included in memory 280 of apparatus 200 for execution by processor 260, in memory of receiver 300 for execution by baseband processing and control 360, or in memory of system 400 for execution by processor 460, RF Macro Main IIC 430, or IFPP 450. The computer-readable medium may include volatile or non-volatile, magnetic, semiconductor, tape, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be appreciated that the present disclosure is not limited to the exact construction that has been described above and illustrated in the accompanying drawings, and that various modifications and changes can be made without departing from the scope thereof. It is intended that the scope of the application should only be limited by the appended claims.

What is claimed is:

1. A communication apparatus for calibrating an in-phase and quadrature (IQ) imbalance of a communication signal including an in-phase component and a quadrature component, the communication apparatus comprising:
    an oscillator circuit outputting a first local oscillator (LO) signal and a second LO signal;
    an in-phase delay circuit configured to adjust a pulse of the first LO signal, and a quadrature delay circuit configured to adjust a pulse of the second LO signal;
    a memory storing instructions and a controller configured to execute the instructions stored in the memory and configured to cause the communication apparatus to:
        determine whether to calibrate the IQ imbalance of the communication signal in the communication apparatus,
        select, in response to a determination to calibrate the IQ imbalance of the communication signal, at least one of an amplitude calibration or a phase calibration, and
        control at least one of the in-phase delay circuit or the quadrature delay circuit to adjust a pulse of at least one of the first LO signal or the second LO signal in accordance with the selected amplitude calibration or phase calibration and to thereby generate an at least one pulse-adjusted LO signal; and
    a mixer configured to multiply the at least one pulse-adjusted LO signal with the communication signal and to thereby calibrate the IQ imbalance.

2. The communication apparatus of claim 1, wherein the controller is configured to cause the communication apparatus to determine whether to calibrate the IQ imbalance of the communication signal by:
    measuring an image-response rejection ratio (IMRR) in the communication signal;
    comparing the IMRR with a threshold; and
    determining to calibrate the IQ imbalance of the communication signal if the IMRR exceeds the threshold.

3. The communication apparatus of claim 1, wherein the controller is configured to cause the communication apparatus to determine whether to calibrate the IQ imbalance of the communication signal by:
    measuring an image-response rejection ratio (IMRR) in the communication signal;
    comparing the IMRR with a first threshold;
    comparing the IMRR with a second threshold if the IMRR exceeds the first threshold; and
    determining to calibrate the IQ imbalance of the communication signal if the IMRR exceeds the second threshold.

4. The communication apparatus of claim 1, wherein the controller is configured to cause the communication apparatus to select at least one of the amplitude calibration or the phase calibration by:
    calculating an amplitude imbalance and a phase imbalance in the communication signal;
    comparing the amplitude imbalance with the phase imbalance;
    selecting the amplitude calibration if the amplitude imbalance exceeds the phase imbalance; and
    selecting the phase calibration if the amplitude imbalance does not exceed the phase imbalance.

5. The communication apparatus of claim 1, wherein the controller is further configured to cause the communication apparatus to:
    determine to calibrate the in-phase component or the quadrature component of the communication signal, wherein:
    in response to a determination to calibrate the in-phase component of the communication signal,
        the controller is configured to control the in-phase delay circuit in order to adjust the pulse of the first LO signal; and
    in response to a determination to calibrate the quadrature component of the communication signal,
        the controller is configured to control the quadrature delay circuit in order to adjust the pulse of the second LO signal.

6. The communication apparatus of claim 5, wherein the controller is configured to cause the communication apparatus to determine to calibrate the in-phase component or the quadrature component of the communication signal by:

if a calibration range of the in-phase component exceeds a calibration range of the quadrature component, determining to calibrate the in-phase component of the communication signal; and if the calibration range of the in-phase component does not exceed the calibration range of the quadrature component, determining to calibrate the quadrature component of the communication signal.

7. The communication apparatus of claim 1, wherein after the communication apparatus selects the amplitude calibration, the controller is further configured to cause the communication apparatus to:

determine if a magnitude of the in-phase component of the communication signal exceeds a magnitude of the quadrature component of the communication signal, wherein the at least one of the in-phase delay circuit or the quadrature delay circuit is configured to adjust the pulse of the at least one of the first LO signal or the second LO signal by controlling the in-phase or quadrature delay circuit to squeeze or expand a pulse width.

8. The communication apparatus of claim 7, wherein:

the in-phase or quadrature delay circuit is configured to squeeze the pulse width by:

adjusting a rising edge of the pulse with a first time delay and a falling edge of the pulse with a first time advance, and the in-phase or quadrature delay circuit is configured to expand the pulse width by:

adjusting the rising edge of the pulse with a second time advance and the falling edge of the pulse with a second time delay.

9. The communication apparatus of claim 8, wherein the controller is further configured to cause the communication apparatus to:

determine the first time advance and the first time delay, or the second time advance and the second time delay in accordance with the magnitude of the in-phase component and the magnitude of the quadrature component of the communication signal.

10. The communication apparatus of claim 1, wherein after the communication apparatus selects the phase calibration, the controller is further configured to cause the communication apparatus to:

determine if a phase imbalance in the communication signal exceeds zero, wherein the in-phase or quadrature delay circuit is configured to adjust the pulse of the at least one of the first LO signal or the second LO signal by time shifting the pulse.

11. The communication apparatus of claim 10, wherein the in-phase or quadrature delay circuit is configured to time shift the pulse by:

adjusting a rising edge and a falling edge of the pulse with a time advance; or adjusting the rising edge and the falling edge of the pulse with a time delay.

12. The communication apparatus of claim 11, wherein the controller is further configured to cause the communication apparatus to:

determine the time advance or the time delay in accordance with the phase imbalance in the communication signal.

13. The communication apparatus of claim 1, wherein the in-phase or quadrature delay circuit is configured to adjust the pulse of the at least one of the first LO signal or the second LO signal by adjusting a delay time of the in-phase or quadrature delay circuit by adjusting a resistance of the in-phase or quadrature delay circuit.

14. The communication apparatus of claim 1, wherein the in-phase or quadrature delay circuit includes a first variable resistor coupled to a first capacitor, and a second variable resistor coupled to a second capacitor.

15. The communication apparatus of claim 1, wherein the in-phase delay circuit and the quadrature delay circuit are part of a delay circuit component.

16. The communication apparatus of claim 1, wherein the controller is configured to cause the communication apparatus to determine whether to calibrate the IQ imbalance of the communication signal periodically.

17. A method for calibrating an in-phase and quadrature (IQ) imbalance of a communication signal including an in-phase component and a quadrature component in a communication apparatus, the method comprising:

determining whether to calibrate the IQ imbalance of the communication signal in the communication apparatus;

selecting, in response to a determination to calibrate the IQ imbalance of the communication signal, at least one of an amplitude calibration or a phase calibration;

controlling, in accordance with the selected amplitude calibration or phase calibration, at least one of an in-phase delay circuit or a quadrature delay circuit to adjust a pulse of at least one of a first LO signal or a second LO signal to thereby generate at least one pulse-adjusted LO signal; and multiplying the at least one pulse-adjusted LO signal with the communication signal to thereby calibrate the IQ imbalance.

18. The method of claim 17, wherein determining whether to calibrate the IQ imbalance of the communication signal includes:

measuring an image-response rejection ratio (IMRR) in the communication signal;

comparing the IMRR with a threshold; and determining to calibrate the IQ imbalance of the communication signal if the IMRR exceeds the threshold.

19. The method of claim 17, wherein determining whether to calibrate the IQ imbalance of the communication signal includes:

measuring an image-response rejection ratio (IMRR) in the communication signal;

comparing the IMRR with a first threshold;

comparing the IMRR with a second threshold if the IMRR exceeds the first threshold; and determining to calibrate the IQ imbalance of the communication signal if the IMRR exceeds the second threshold.

20. The method of claim 17, wherein selecting at least one of the amplitude calibration or the phase calibration includes:

calculating an amplitude imbalance and a phase imbalance in the communication signal;

comparing the amplitude imbalance with the phase imbalance;

selecting the amplitude calibration if the amplitude imbalance exceeds the phase imbalance; and selecting the phase calibration if the amplitude imbalance does not exceed the phase imbalance.

21. The method of claim 17, further comprising:

determining to calibrate the in-phase component or the quadrature component of the communication signal, wherein:

in response to a determination to calibrate the in-phase component of the communication signal, controlling the at least one of the in-phase delay circuit or the quadrature delay circuit to adjust the pulse of the at least one of the first LO signal or the second LO signal includes controlling the in-phase delay circuit to adjust a pulse of the first LO signal; and in response to a determination to calibrate the quadrature component of the communication signal, controlling the at least one of the in-phase delay circuit or the quadrature delay circuit to adjust the pulse of the at least one of the first LO signal or the second LO signal includes controlling the quadrature delay circuit to adjust a pulse of the second LO signal.

22. The method of claim 21, wherein determining to calibrate the in-phase component or the quadrature component of the communication signal includes:

if a calibration range of the in-phase component exceeds a calibration range of the quadrature component, determining to calibrate the in-phase component of the communication signal; or if the calibration range of the in-phase component does not exceed the calibration range of the quadrature component, determining to calibrate the quadrature component of the communication signal.

23. The method of claim 17, wherein after the amplitude calibration is selected, the method further comprises:

determining if a magnitude of the in-phase component of the communication signal exceeds a magnitude of the quadrature component of the communication signal, wherein controlling the at least one of the in-phase delay circuit or the quadrature delay circuit to adjust the pulse of the at least one of the first LO signal or the second LO signal includes controlling the in-phase or quadrature delay circuit to squeeze or expand a pulse width.

24. The method of claim 23, wherein:

controlling the in-phase or quadrature delay circuit to squeeze the pulse width includes:

adjusting a rising edge of the pulse with a first time delay and a falling edge of the pulse with a first time advance, and controlling the in-phase or quadrature delay circuit to expand the pulse width includes:

adjusting the rising edge of the pulse with a second time advance and the falling edge of the pulse with a second time delay.

25. The method of claim 24, further comprising:
determining the first time advance and the first time delay, or the second time advance and the second time delay in accordance with the magnitude of the in-phase component and the magnitude of the quadrature component of the communication signal.

26. The method of claim 17, wherein after the phase calibration is selected, the method further comprises:

determining if a phase imbalance in the communication signal exceeds zero, wherein controlling the at least one of the in-phase delay circuit or the quadrature delay circuit to adjust the pulse of the at least one of the first LO signal or the second LO signal includes controlling the in-phase or quadrature delay circuit to time shift the pulse.

27. The method of claim 26, wherein controlling the in-phase or quadrature delay circuit to time shift the pulse includes:

adjusting a rising edge and a falling edge of the pulse with a time advance; or adjusting the rising edge and the falling edge of the pulse with a time delay.

28. The method of claim 27, further comprising:
determining the time advance or the time delay in accordance with the phase imbalance in the communication signal.

29. The method of claim 17, wherein controlling the at least one of the in-phase delay circuit or the quadrature delay circuit to adjust the pulse of the at least one of the first LO signal or the second LO signal includes adjusting a delay time of the in-phase or quadrature delay circuit by adjusting a resistance of the in-phase or quadrature delay circuit.

30. The method of claim 29, wherein the in-phase or quadrature delay circuit includes a first variable resistor coupled to a first capacitor, and a second variable resistor coupled to a second capacitor.

31. The method of claim 17, wherein the in-phase delay circuit and the quadrature delay circuit are part of a delay circuit component.

32. The method of claim 17, wherein determining whether to calibrate the IQ imbalance of the communication signal includes determining whether to calibrate the IQ imbalance periodically.

33. A radio frequency (RF) circuit for calibrating an in-phase and quadrature (IQ) imbalance of a communication signal including an in-phase component and a quadrature component, the RF circuit comprising:

an oscillator circuit outputting a first local oscillator (LO) signal and a second LO signal;

an in-phase delay circuit configured to adjust a pulse of the first LO signal, and a quadrature delay circuit configured to adjust a pulse of the second LO signal;

a control circuit configured to cause the RF circuit to:
determine whether to calibrate the IQ imbalance of the communication signal in the RF circuit, select, in response to a determination to calibrate the IQ imbalance of the communication signal, at least one of an amplitude calibration or a phase calibration, and control at least one of the in-phase delay circuit or the quadrature delay circuit to adjust a pulse of the at least one of the first LO signal or the second LO signal in accordance with the selected amplitude calibration or phase calibration and to thereby generate an at least one pulse-adjusted LO signal; and a mixer configured to multiply the at least one pulse-adjusted LO signal with the communication signal and to thereby calibrate the IQ imbalance.

* * * * *